United States Patent
Kandanarachchi et al.

(10) Patent No.: US 9,291,901 B2
(45) Date of Patent: Mar. 22, 2016

(54) AMINE TREATED MALEIC ANHYDRIDE POLYMERS WITH PENDENT SILYL GROUP, COMPOSITIONS AND APPLICATIONS THEREOF

(71) Applicant: PROMERUS, LLC, Brecksville, OH (US)

(72) Inventors: Pramod Kandanarachchi, Brecksville, OH (US); Larry F. Rhodes, Brecksville, OH (US)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 0 days.

(21) Appl. No.: 14/477,946

(22) Filed: Sep. 5, 2014

(65) Prior Publication Data

US 2015/0079507 A1    Mar. 19, 2015

Related U.S. Application Data

(60) Provisional application No. 61/878,275, filed on Sep. 16, 2013.

(51) Int. Cl.
| | | |
|---|---|---|
| G03F 7/075 | (2006.01) |
| G03F 7/038 | (2006.01) |
| G03F 7/039 | (2006.01) |
| G03F 7/40 | (2006.01) |
| C08F 232/02 | (2006.01) |
| C08F 232/08 | (2006.01) |
| C08F 230/08 | (2006.01) |
| C08F 220/08 | (2006.01) |
| C08F 8/12 | (2006.01) |
| C08F 8/32 | (2006.01) |
| C08F 8/44 | (2006.01) |
| C08F 8/48 | (2006.01) |
| G03F 7/004 | (2006.01) |
| G03F 7/022 | (2006.01) |
| G03F 7/30 | (2006.01) |
| G03F 7/32 | (2006.01) |
| C08F 222/08 | (2006.01) |
| C08F 232/04 | (2006.01) |
| C08F 222/06 | (2006.01) |
| C09D 135/00 | (2006.01) |
| C09D 135/06 | (2006.01) |
| C09D 145/00 | (2006.01) |

(52) U.S. Cl.
CPC .............. *G03F 7/0758* (2013.01); *C08F 8/12* (2013.01); *C08F 8/32* (2013.01); *C08F 8/44* (2013.01); *C08F 8/48* (2013.01); *C08F 220/08* (2013.01); *C08F 222/06* (2013.01); *C08F 222/08* (2013.01); *C08F 230/08* (2013.01); *C08F 232/04* (2013.01); *C08F 232/08* (2013.01); *C09D 135/00* (2013.01); *C09D 135/06* (2013.01); *C09D 145/00* (2013.01); *G03F 7/0048* (2013.01); *G03F 7/0226* (2013.01); *G03F 7/038* (2013.01); *G03F 7/039* (2013.01); *G03F 7/0757* (2013.01); *G03F 7/30* (2013.01); *G03F 7/322* (2013.01); *G03F 7/40* (2013.01); *C08F 2800/10* (2013.01)

(58) Field of Classification Search
None
See application file for complete search history.

(56) References Cited

U.S. PATENT DOCUMENTS

| 6,770,419 | B2 * | 8/2004 | Khojasteh et al. | 430/270.1 |
|---|---|---|---|---|
| 2002/0177066 | A1 * | 11/2002 | Song et al. | 430/270.1 |
| 2010/0261123 | A1 * | 10/2010 | Tanaka et al. | 430/325 |
| 2011/0130538 | A1 * | 6/2011 | Brainard | 528/170 |
| 2012/0129101 | A1 * | 5/2012 | Onishi et al. | 430/283.1 |

FOREIGN PATENT DOCUMENTS

WO    WO 2004/068243 A1    8/2004

OTHER PUBLICATIONS

Tsong-Shin Jean et al., "Silicon Containing Photoresists," Journal of Photopolymer Science and Technology, vol. 14, No. 3, 2001, pp. 503-506.

* cited by examiner

*Primary Examiner* — Sin Lee
(74) *Attorney, Agent, or Firm* — Balaram Gupta

(57) ABSTRACT

Disclosed herein are various amine treated maleic anhydride containing polymers and compositions thereof, which are useful for forming self-imageable films. In some embodiments, such polymers encompass norbornene-type repeating units containing pendent silyl groups and maleic anhydride-type repeating units where at least some of such maleic anhydride-type repeating units are either ring-opened or have been transformed into maleimide repeat units. The films formed from such copolymer compositions provide self imageable, low-k, thermally stable layers for use in microelectronic and optoelectronic devices.

18 Claims, No Drawings

AMINE TREATED MALEIC ANHYDRIDE POLYMERS WITH PENDENT SILYL GROUP, COMPOSITIONS AND APPLICATIONS THEREOF

CROSS REFERENCE TO RELATED APPLICATIONS

This application claims the benefit of U.S. Provisional Application No. 61/878,275, filed Sep. 16, 2013, which is incorporated herein by reference in its entirety.

TECHNICAL FIELD

The present invention relates to a series of maleic anhydride containing olefinic polymers containing pendent silyl groups and the resulting amine treated polymers derived therefrom. More specifically, the present invention relates to a series of maleic anhydride containing copolymers with different olefins, including norbornene-type cycloolefinic monomers containing pendent silyl groups, including the polymers derived from the ring-opening of the maleic anhydride repeating unit by reaction with an amine. This invention also relates to methods of making these polymers and applications thereof. In particular, the polymers of this invention are found to be useful in various electronic material applications, including as overcoat layers in liquid crystal displays and in a variety of redistribution layer applications.

BACKGROUND

There has been a growing interest in developing new electronic materials featuring superior chemical, optical and mechanical properties, which are environmentally friendly and can be processed under aqueous conditions. Most notably, there is a growing demand for developing materials which are capable of forming micron-level structures. In particular, micron-level device geometries have become common place in the fabrication of a variety of liquid crystal displays (LCDs), organic light emitting diodes (OLEDs) and other radio frequency (RF) and microwave devices. For example, devices such as radio frequency integrated circuits (RFICs), micro-machine integrated circuits (MMICs), switches, couplers, phase shifters, surface acoustic wave (SAW) filters and SAW duplexers, have recently been fabricated in the micron-levels.

With such smaller geometries comes a requirement for dielectric materials with low dielectric constants to reduce or eliminate any cross-talk between adjacent signal lines or between a signal line and a device feature (e.g. a pixel electrode) due to capacitive coupling. Although many low dielectric (low-K) materials are available for microelectronic devices, for optoelectronic devices such materials must also be broadly transparent in the visible light spectrum, not require high temperature processing (greater than 300° C.) that would be incompatible with other elements of such an optoelectronic device, and be both low-cost and feasible for large scale optoelectronic device fabrication. Also there is a need for developing electronic materials which exhibits low wafer stress.

Thus, it would be desirable to have a material capable of forming a self-imageable layer to avoid the need for depositing a separate imaging layer. Such material should also be easy to apply to a substrate, have a low dielectric constant (3.9 or less) and thermal stability to temperatures in excess of 250° C. Of course, it is also desirable to have such materials available at a lower cost, feature such properties as positive or negative tone photoimaging capability, aqueous base developing capability, low defects after thermal cycling test (TCT), high transparency after heat stress, desired thermo-mechanical properties, such as tensile strength, elongation to break (ETB), coefficient of thermal expansion (CTE), desirable glass transition temperature ($T_g$), low wafer stress, low weight loss and ability to retain pattern integrity at curing temperatures.

It has been reported that acrylic polymers, which are inexpensive, offer good photoimaging properties and are aqueous base developable, see for example, Japanese Patent Application Laid-open No. Hei 5-165214 and the radiation-sensitive resin composition comprising an alicyclic olefin resin disclosed in Japanese Patent Application Laid-open No. 2003-162054. Similarly, polyimides have been reported to provide good thermal stability. However, these materials have certain deficiencies and thus making them not so suitable for the applications contemplated herein. For instance, acrylics are not suitable for applications requiring high thermal stability (i.e., temperatures higher than 200° C.), and many of the polyimides in general are not suitable for either positive tone or negative tone formulations requiring aqueous base developability and generally do not exhibit desirable transparency, thus making them unsuitable in certain optoelectronic applications. Although some polyimides have low dielectric constants but still may not have low enough permittivity to be effective in highly integrated and/or miniaturized devices having increased wiring density and high signal speed. One such known polyimide material is the positive tone type photosensitive resin comprising a polyimide precursor and a diazoquinone-type compound disclosed in Japanese Patent No. 3,262,108.

Recently, it has been reported that certain copolymers containing both norbornene-type repeat units and maleic anhydride-type repeat units are useful in certain microelectronic applications featuring self-image forming layer capability, when image-wise-exposed to actinic radiation, see co-pending U.S. Patent Application Publication No. US2013-0017488A1, published Jan. 17, 2013. These compositions are however suitable only for positive tone photoimaging and thermal curing with added additives to the polymeric composition. Thus there is still a need for polymeric compositions which can not only self-crosslink but also can be employed both as positive and negative tone compositions.

Thus, at least one of the solutions provided by this invention, among others, is to provide certain polymeric materials which are capable of forming films featuring desirable optoelectronic properties such as high transparency at various wavelengths from 400 nm to 700 nm, which films retain such high transparency properties even after thermal stress. Another non-limiting solution provided by this invention is to provide a variety of polymeric materials as disclosed herein which when formed into films exhibit excellent chemical resistance to commonly used chemicals and solvents in the electronic and optoelectronic material processing.

DETAILED DESCRIPTION

Embodiments in accordance with the present invention are directed to various polymers, including but not limited to, copolymers, terpolymers and tetrapolymers that encompass at least one repeating unit derived from a maleic anhydride monomer. In some other embodiments, the polymer of this invention contains a repeating unit derived from a maleic anhydride monomer that is at least partially ring opened and/or converted to a maleimide, amic acid or other related repeat units derived therefrom, as such are defined hereinafter, and to compositions encompassing such polymers. The polymers of this invention also contain a certain type of norbornene-type monomer containing one or more silyl pendent group as described herein. Such polymer compositions being capable of forming self-imageable films useful as layers in the manufacture of microelectronic and optoelectronic devices. That is to say that, after image-wise exposure to actinic radiation, such layers (or films) can be developed to form patterned layers (or films), where such pattern is reflective of the image through which the layers (or films) was exposed. In this manner, structures can be provided that are, or are to become, a part of such microelectronic and/or optoelectronic devices.

The terms as used herein have the following meanings:

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all sub-ranges subsumed therein. For example, a stated range of from "1 to 10" should be considered to include any and all sub-ranges between the minimum value of 1 and the maximum value of 10. Exemplary sub-ranges of the range 1 to 10 include, but are not limited to, 1 to 6.1, 3.5 to 7.8, and 5.5 to 10, etc.

As used herein, "hydrocarbyl" refers to a radical of a group that contains carbon and hydrogen atoms, non-limiting examples being alkyl, cycloalkyl, aryl, aralkyl, alkaryl, and alkenyl. The term "halohydrocarbyl" refers to a hydrocarbyl group where at least one hydrogen has been replaced by a halogen. The term perhalocarbyl refers to a hydrocarbyl group where all hydrogens have been replaced by a halogen.

As used herein, the expression "$(C_1-C_{15})$alkyl" includes methyl and ethyl groups, and straight-chained or branched propyl, butyl, pentyl, hexyl, heptyl, and various other homolog groups. Particular alkyl groups are methyl, ethyl, n-propyl, isopropyl and tert-butyl, etc. Derived expressions, such as "$(C_1-C_{15})$alkoxy", "$(C_1-C_{15})$thioalkyl" "$(C_1-C_{15})$alkoxy$(C_1-C_{15})$alkyl", "hydroxy$(C_1-C_{15})$alkyl", "$(C_1-C_{15})$alkylcarbonyl", "$(C_1-C_{15})$alkoxycarbonyl$(C_1-C_{15})$alkyl", "$(C_1-C_{15})$alkoxycarbonyl", "amino$(C_1-C_{15})$alkyl", "$(C_1-C_{15})$alkylamino", "$(C_1-C_{15})$alkylcarbamoyl$(C_1-C_{15})$alkyl", "$(C_1-C_{15})$dialkylcarbamoyl$(C_1-C_{15})$alkyl" "mono- or di-$(C_1-C_{15})$alkylamino$(C_1-C_{15})$alkyl", "amino$(C_1-C_{15})$alkylcarbonyl" "diphenyl$(C_1-C_{15})$alkyl", "phenyl$(C_1-C_{15})$alkyl", "phenylcarboyl$(C_1-C_{15})$alkyl" and "phenoxy$(C_1-C_{15})$alkyl" are to be construed accordingly.

As used herein, the expression "cycloalkyl" includes all of the known cyclic radicals. Representative examples of "cycloalkyl" includes without any limitation cyclopropyl, cyclobutyl, cyclopentyl, cyclohexyl, cycloheptyl, cyclooctyl, and the like. Derived expressions such as "cycloalkoxy", "cycloalkylalkyl", "cycloalkylaryl", "cycloalkylcarbonyl" are to be construed accordingly.

As used herein, the expression "$(C_2-C_6)$alkenyl" includes ethenyl and straight-chained or branched propenyl, butenyl, pentenyl and hexenyl groups. Similarly, the expression "$(C_2-C_6)$alkynyl" includes ethynyl and propynyl, and straight-chained or branched butynyl, pentynyl and hexynyl groups.

As used herein the expression "$(C_1-C_4)$acyl" shall have the same meaning as "$(C_1-C_4)$alkanoyl", which can also be represented structurally as "R—CO—," where R is a $(C_1-C_3)$ alkyl as defined herein. Additionally, "$(C_1-C_3)$alkylcarbonyl" shall mean same as $(C_1-C_4)$acyl. Specifically, "$(C_1-C_4)$acyl" shall mean formyl, acetyl or ethanoyl, propanoyl, n-butanoyl, etc. Derived expressions such as "$(C_1-C_4)$acyloxy" and "$(C_1-C_4)$acyloxyalkyl" are to be construed accordingly.

As used herein, the expression "$(C_1-C_{15})$perfluoroalkyl" means that all of the hydrogen atoms in said alkyl group are replaced with fluorine atoms. Illustrative examples include trifluoromethyl and pentafluoroethyl, and straight-chained or branched heptafluoropropyl, nonafluorobutyl, undecafluoropentyl and tridecafluorohexyl groups. Derived expression, "$(C_1-C_{15})$perfluoroalkoxy", is to be construed accordingly.

As used herein, the expression "$(C_6-C_{10})$aryl" means substituted or unsubstituted phenyl or naphthyl. Specific examples of substituted phenyl or naphthyl include o-, p-, m-tolyl, 1,2-, 1,3-, 1,4-xylyl, 1-methylnaphthyl, 2-methylnaphthyl, etc. "Substituted phenyl" or "substituted naphthyl" also include any of the possible substituents as further defined herein or one known in the art. Derived expression, "$(C_6-C_{10})$arylsulfonyl," is to be construed accordingly.

As used herein, the expression "$(C_6-C_{10})$aryl$(C_1-C_4)$alkyl" means that the $(C_6-C_{10})$aryl as defined herein is further attached to $(C_1-C_4)$alkyl as defined herein. Representative examples include benzyl, phenylethyl, 2-phenylpropyl, 1-naphthylmethyl, 2-naphthylmethyl and the like.

As used herein, the expression "heteroaryl" includes all of the known heteroatom containing aromatic radicals. Representative 5-membered heteroaryl radicals include furanyl, thienyl or thiophenyl, pyrrolyl, isopyrrolyl, pyrazolyl, imidazolyl, oxazolyl, thiazolyl, isothiazolyl, and the like. Representative 6-membered heteroaryl radicals include pyridinyl, pyridazinyl, pyrimidinyl, pyrazinyl, triazinyl, and the like radicals. Representative examples of bicyclic heteroaryl radicals include, benzofuranyl, benzothiophenyl, indolyl, quinolinyl, isoquinolinyl, cinnolyl, benzimidazolyl, indazolyl, pyridofuranyl, pyridothienyl, and the like radicals.

As used herein, the expression "heterocycle" includes all of the known reduced heteroatom containing cyclic radicals. Representative 5-membered heterocycle radicals include tetrahydrofuranyl, tetrahydrothiophenyl, pyrrolidinyl, 2-thiazolinyl, tetrahydrothiazolyl, tetrahydrooxazolyl, and the like. Representative 6-membered heterocycle radicals include piperidinyl, piperazinyl, morpholinyl, thiomorpholinyl, and the like. Various other heterocycle radicals include, without limitation, aziridinyl, azepanyl, diazepanyl, diazabicyclo[2.2.1]hept-2-yl, and triazocanyl, and the like.

"Halogen" or "halo" means chloro, fluoro, bromo, and iodo.

In a broad sense, the term "substituted" is contemplated to include all permissible substituents of organic compounds. In a few of the specific embodiments as disclosed herein, the term "substituted" means substituted with one or more substituents independently selected from the group consisting of $C_{1-6}$alkyl, $C_{2-6}$alkenyl, $C_{1-6}$perfluoroalkyl, phenyl, hydroxy, —$CO_2H$, an ester, an amide, $C_1-C_6$alkoxy, $C_1-C_6$thioalkyl, $C_1-C_6$perfluoroalkoxy, —$NH_2$, Cl, Br, I, F, —NH-lower alkyl, and —N(lower alkyl)$_2$. However, any of the other suitable substituents known to one skilled in the art can also be used in these embodiments.

The statements below, wherein, for example, $R_5$ and $R_6$ are said to be independently selected from a group of substituents, means that $R_5$ and $R_6$ are independently selected, to but also that where an $R_5$ variable occurs more than once in a molecule, those occurrences are independently selected (e.g., if $R_1$ and $R_2$ are each contains a group of formula (A), $R_5$ can be hydrogen in $R_1$, and $R_5$ can be methyl in $R_2$). Those skilled in the art will recognize that the size and nature of the substituent(s) can affect the number and nature of other substituents that can be present.

It should be noted that any atom with unsatisfied valences in the text, schemes, examples and tables herein is assumed to have the appropriate number of hydrogen atom(s) to satisfy such valences.

As used herein, the terms "polymer composition," "copolymer composition," "terpolymer composition" "tetrapolymer composition" are used herein interchangeably and are meant to include at least one synthesized polymer, copolymer, terpolymer or tetrapolymer, as well as residues from initiators, solvents or other elements attendant to the synthesis of such polymers, where such residues are understood as not being covalently incorporated thereto. Such residues and other elements considered as part of the "polymer" or "polymer composition" are typically mixed or co-mingled with the polymer such that they tend to remain therewith when it is transferred between vessels or between solvent or dispersion media. A polymer composition can also include materials added after synthesis of the polymer to provide or modify specific properties of such composition. Such materials include, but are not limited to solvent(s), antioxidant(s), photoinitiator(s), sensitizers and other materials as will be discussed more fully below.

By the term "derived" is meant that the polymeric repeating units are polymerized (formed) from, e.g., polycyclic norbornene-type monomers, in accordance with formulae (I) or (III), or maleic anhydride monomers of formula (II) wherein the resulting polymers are formed by 2,3 enchainment of norbornene-type monomers with maleic anhydride monomers as shown below:

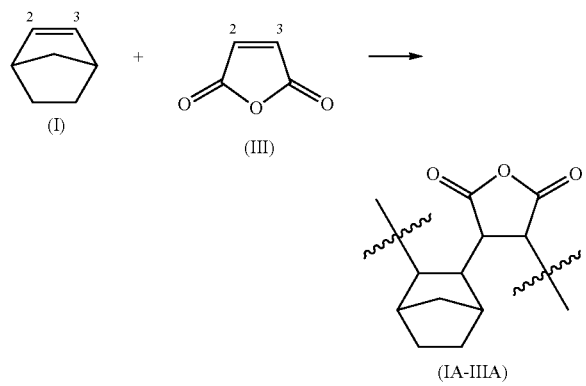

It should be understood that depending upon the monomeric compositions in a given polymer the repeat units may not always be alternating. That is to say, for example, in a copolymer containing especially other than 50:50 molar ratios of norbornene-type monomers with maleic anhydride monomers, the repeat units are not always alternating but with random blocks of monomers with the higher molar content. It should further be noted that, as one of skill in the art readily appreciates, depending upon the type of monomers employed, i.e., norbornene-type monomers of formula (I) or other olefinic monomers of formula (II), each of which may polymerize differently with maleic anhydride, and therefore, the resulting polymer need not be alternating even when only one type of monomer of formula (I) or (II) is employed with maleic anhydride copolymer and even at a molar ratio of 50:50. Thus, it is possible to form polymers containing various ratios of monomers with random or alternating order. In particular, the order of monomers in the polymer chain is not important to this invention and can be random or alternating depending upon the types of monomers employed.

It will be understood that the terms "dielectric" and "insulating" are used interchangeably herein. Thus reference to an insulating material or layer is inclusive of a dielectric material or layer and vice versa.

The term "low K" refers in general to a dielectric constant less than that of thermally formed silicon dioxide (3.9) and when used in reference to a "low-K material" it will be understood to mean a material having a dielectric constant of less than 3.9.

It will be understood that the term "redistribution layer (RDL)" refers to an electrical signal routing insulation material which features desirable and reliable properties. The term RDL may also be used interchangeably to describe buffer coating layers, such as for example, a stress relief or buffer layer between the solder ball and fragile structure, also generally featuring low dielectric constant.

The term "photodefinable" refers to the characteristic of a material or composition of materials, such as a polymer composition in accordance with embodiments of the present invention, to be formed into, in and of itself, a patterned layer or a structure. In alternate language, a "photodefinable layer" does not require the use of another material layer formed thereover, for example a photoresist layer, to form the aforementioned patterned layer or structure. It will be further understood that a polymer composition having such a characteristic be employed in a pattern forming scheme to form a patterned film/layer or structure. It will be noted that such a scheme incorporates an "imagewise exposure" of the photodefinable material or layer. Such imagewise exposure being taken to mean an exposure to actinic radiation of selected portions of the layer, where non-selected portions are protected from such exposure to actinic radiation. Furthermore, "photodefinable," "photoimageable" or "photosensitive" as used herein shall mean the same and are used interchangeably herein.

The term "cure" (or "curing") as used in connection with a composition, e.g., "a cured composition," shall mean that at least a portion of the crosslinkable components which are encompassed by the composition are at least partially crosslinked. In some embodiments of the present invention, the crosslinking is sufficient to render the polymer film insoluble in the developer and in some other embodiments the polymer film is insoluble in commonly used solvents. One skilled in the art will understand that the presence and degree of crosslinking (crosslink density) can be determined by a variety of methods, such as dynamic mechanical thermal analysis (DMTA). This method determines the glass transition temperature and crosslink density of free films of coatings or polymers. These physical properties of a cured material are related to the structure of the crosslinked network. Higher crosslink density values indicate a higher degree of crosslinking in the coating or film.

Monomers

Various monomers that are contemplated to be part of polymer composition embodiments in accordance with the present invention are generally known in the art. In general, the polymers of this invention encompass a wide range of "polycyclic" repeating units. As defined herein, the terms "polycyclic olefin" or "polycycloolefin" mean the same and are used interchangeably to represent several of the monomeric compounds used to prepare the polymers of this invention. As a representative example of such a compound or a monomer is "norbornene-type" monomer and is generally referred to herein as addition polymerizable monomer (or the resulting repeating unit), that encompass at least one norbornene moiety such as shown below:

The simplest norbornene-type or polycyclic olefin monomer encompassed by embodiments in accordance with the present invention is the bicyclic monomer, bicyclo[2.2.1]hept-2-ene, commonly referred to as norbornene. However, the term norbornene-type monomer or repeating unit is used herein to mean norbornene itself as well as any substituted norbornene(s), or substituted and unsubstituted higher cyclic derivatives thereof. Representative examples of such monomers include but not limited to bicyclo[2.2.2]oct-2-ene, 1,2,3,4,4a,5,8,8a-octahydro-1,4:5,8-dimethanonaphthalene, 1,4,4a,5,6, 7, 8, 8a-octahydro-1,4-epoxy-5,8-methanonaphthalene, and the like.

In some embodiments of this invention the polymers as disclosed herein also encompass repeat units derived from any of the olefinic monomers as represented by formula (II) or certain of the norbornene-type monomers of the formula (IV) as described herein. Additionally, the polymers of this invention also encompass repeat units derived from maleic anhydride monomers as represented by formula (III).

As mentioned above, the monomeric compounds employed in this invention can be synthesized by any of the procedures known to one skilled in the art. Specifically, several of the starting materials used in the preparation of the monomers used herein are known or are themselves commercially available. The monomers employed herein as well as several of the precursor compounds may also be prepared by methods used to prepare similar compounds as reported in the literature and as further described herein.

Polymers

In accordance with the practice of this invention there is provided a polymer comprising:

a first type of repeating unit represented by formula (IA), said first type of repeating unit is derived from a monomer of formula (I):

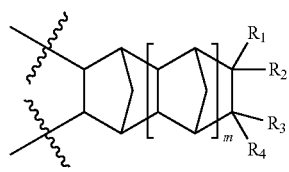

(IA)

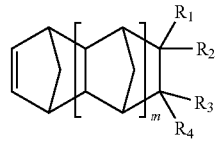

(I)

wherein:
m is an integer 0, 1 or 2;
at least one of $R_1$, $R_2$, $R_3$ and $R_4$ independently represents a group of formula (A):

$$—SiR_5R_6R_7 \quad (A)$$

wherein:
$R_5$, $R_6$, and $R_7$ are the same or different and each independently of one another is selected from linear or branched $(C_1-C_6)$alkyl, $(C_5-C_8)$cycloalkyl, $(C_6-C_{10})$aryl or $(C_7-C_{12})$aralkyl;

remaining one or more of $R_1$, $R_2$, $R_3$ and $R_4$ independently represents hydrogen, linear or branched $(C_1-C_{16})$alkyl, hydroxy$(C_1-C_{16})$alkyl, perfluoro$(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_3)$alkyl, perfluoro$(C_6-C_{10})$aryl, perfluoro$(C_6-C_{10})$aryl$(C_1-C_3)$alkyl, $(C_5-C_{10})$heteroaryl, $(C_5-C_{10})$heteroaryl$(C_1-C_3)$alkyl, hydroxy, $(C_1-C_{12})$alkoxy, $(C_3-C_{12})$cycloalkoxy, $(C_6-C_{12})$bicycloalkoxy, $(C_7-C_{14})$tricycloalkoxy, $(C_6-C_{10})$aryloxy$(C_1-C_3)$alkyl, $(C_5-C_{10})$heteroaryloxy$(C_1-C_3)$alkyl, $(C_6-C_{10})$aryloxy, $(C_5-C_{10})$heteroaryloxy, $(C_1-C_6)$acyloxy, halogen, oxiranyl$(C_0-C_8)$alkyl, oxiranyl$(CH_2)_aO(CH_2)_b$—, or a group of formula (B):

$$—(CH_2)_a—(OCH_2—CH_2)_b—OR \quad (B)$$

wherein:
a is an integer 0, 1, 2, 3 or 4;
b is an integer 0, 1, 2, 3 or 4; and
R is linear or branched $(C_1-C_6)$alkyl, $(C_5-C_8)$cycloalkyl, $(C_6-C_{10})$aryl or $(C_7-C_{12})$aralkyl;

optionally a second type of repeating unit represented by formula (IIA), said second type of repeating unit is derived from a monomer of formula (II):

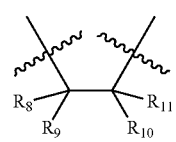

(IIA)

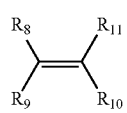

(II)

wherein
$R_8$, $R_9$, $R_{10}$ and $R_{11}$ are the same or different and each independently of one another is selected from hydrogen, linear or branched $(C_1-C_6)$alkyl, $(C_5-C_8)$cycloalkyl, $(C_6-C_{10})$aryl or $(C_7-C_{12})$aralkyl or a group of formula (C):

$$—SiR_5R_6R_7 \quad (C)$$

wherein:
$R_5$, $R_6$, and $R_7$ are the same or different and each independently of one other is selected from linear or branched $(C_1-C_6)$alkyl, $(C_5-C_8)$cycloalkyl, $(C_6-C_{10})$aryl or $(C_7-C_{12})$aralkyl; or one of $R_8$ or $R_9$ taken together with one of $R_{10}$ or $R_{11}$ and the carbon atoms to which they are attached form a $(C_5-C_8)$ cycloalkyl ring; and a third type of repeating unit represented by formula (IIIC), said third type of repeating unit is derived from a monomer of formula (III):

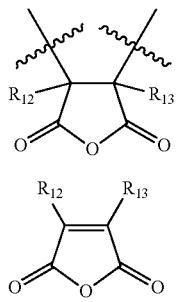

(IIIC)

(III)

wherein:

$R_{12}$ and $R_{13}$ are each independently of one another represents hydrogen or linear or branched $(C_1-C_9)$alkyl or fluorinated or perfluorinated $(C_1-C_9)$alkyl; and wherein each of aforementioned groups, where valence is permissible, is optionally substituted with one or more groups selected from linear or branched $(C_1-C_6)$alkyl, $(C_3-C_7)$cycloalkyl, $(C_1-C_6)$perfluoroalkyl, $(C_1-C_6)$alkoxy, $(C_3-C_7)$cycloalkoxy, $(C_1-C_6)$perfluoroalkoxy, halogen, hydroxy, linear or branched hydroxy$(C_1-C_6)$alkyl, $(C_6-C_{10})$aryl or $(C_7-C_{12})$ aralkyl; and wherein each of aforementioned groups, where valence is permissible, is optionally substituted with one or more groups selected from linear or branched $(C_1-C_6)$alkyl, $(C_3-C_7)$cycloalkyl, $(C_1-C_6)$perfluoroalkyl, $(C_1-C_6)$alkoxy, $(C_3-C_7)$cycloalkoxy, $(C_1-C_6)$perfluoroalkoxy, halogen, hydroxy, linear or branched hydroxy$(C_1-C_6)$alkyl, $(C_6-C_{10})$ aryl or $(C_7-C_{12})$aralkyl.

In some embodiments, the polymer of this invention further encompasses a fourth type of repeating unit represented by formula (IVA), said fourth type of repeating unit is derived from a monomer of formula (IV):

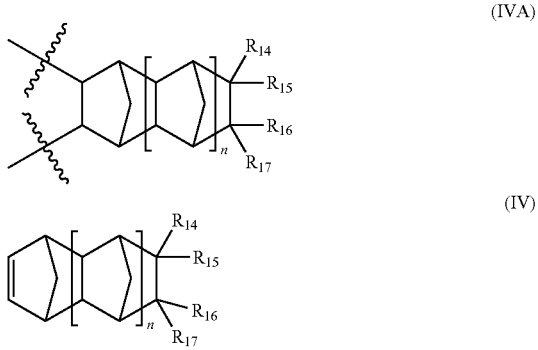

(IVA)

(IV)

wherein:

n is an integer 0, 1 or 2;

$R_{14}$, $R_{15}$, $R_{16}$ and $R_{17}$ independently represents hydrogen, linear or branched $(C_1-C_{16})$alkyl, hydroxy$(C_1-C_{16})$alkyl, perfluoro$(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl $(C_1-C_3)$alkyl, perfluoro$(C_6-C_{10})$aryl, perfluoro$(C_6-C_{10})$aryl $(C_1-C_3)$alkyl, $(C_5-C_{10})$heteroaryl, $(C_5-C_{10})$heteroaryl$(C_1-C_8)$alkyl, di$(C_1-C_2)$alkylmaleimide$(C_3-C_6)$alkyl, di$(C_1-C_2)$ alkylmaleimide$(C_2-C_6)$alkoxy$(C_1-C_2)$alkyl, hydroxy, $(C_1-C_{12})$alkoxy, $(C_3-C_{12})$cycloalkoxy, $(C_6-C_{12})$bicycloalkoxy, $(C_7-C_{14})$tricycloalkoxy, $(C_6-C_{10})$aryloxy$(C_1-C_3)$alkyl, $(C_5-C_{10})$heteroaryloxy$(C_1-C_3)$alkyl, $(C_6-C_{10})$aryloxy, $(C_5-C_{10})$ heteroaryloxy, $(C_1-C_6)$acyloxy, halogen, oxiranyloxy$(C_1-C_3)$ alkyl, oxiranyl$(C_0-C_8)$alkyl, oxiranyl$(CH_2)_aO(CH_2)_b$—, or a group of formula (B):

$$-(CH_2)_a-(OCH_2-CH_2)_b-OR \qquad (B)$$

wherein:

a is an integer 0, 1, 2, 3 or 4;

b is an integer 0, 1, 2, 3 or 4; and

R is linear or branched $(C_1-C_6)$alkyl, $(C_5-C_8)$cycloalkyl, $(C_6-C_{10})$aryl or $(C_7-C_{12})$aralkyl.

It should be noted that polymer embodiments of this invention provides several advantages over polymers as disclosed in the aforementioned co-pending U.S. patent application Ser. No. 13/550,586, filed Jul. 16, 2012. One of such advantages, among others, include reduced steps to make photosensitive formulations encompassing the polymers of this invention. For instance, various steps may have to be employed for forming the photosensitive formulations of the previously disclosed alcohol ring-opened maleic anhydride copolymers. Whereas the polymers of this invention are formed by a fewer steps that feature not only improved properties but are also cost effective. In addition, the processes to make polymers of this invention also involve steps that avoids introduction of any undesirable impurities such as alkali metals, acidification or multiple water-wash steps thus providing significant cost savings. It should be noted that these steps can increase trace metal, acid and water levels in the polymer as well as increasing the complexity and potential loss of yield with each step. In addition, certain of the monomers utilized in making the polymers of this invention are generally derived from much cheaper monomers, such as for example monomers of formulae (II) or (III).

In general, the polymers of this invention can be made by any of the known methods in the art. For example, a non-limiting method of preparing the polymers of this invention involves first polymerizing one or more monomers of formula (I) with desired amounts of maleic anhydride monomer of formula (III), generally, under free radical polymerization conditions. During this step one or more monomers of formula (II) or (IV) can also be employed. The maleic anhydride repeat units of formula (IIIC) can be ring opened either partially or completely by subjecting to suitable reaction conditions to form repeat units of formula (IIIA), (IIIB), (IIID) or (IIIE) as described herein, which are called hereinafter as "ROMI" polymers (i.e., amine ring opened maleimide repeat unit containing polymers). Again, any of the polymerization methods can be employed to form the polymers of this invention. In general, the polymerization can be carried out either in solution using a desirable solvent or in mass, and in both instances, suitably in the presence of a catalyst or an initiator. Any of the known catalyst system which brings about the polymerization of the monomers of formula (III) with monomers of formula (I) or monomers of formula (II) or monomers of formula (IV) in combination with monomers of formula (I) and (II).

Advantageously, it has now been found that polymers of this invention can be prepared by any of the known free radical polymerization procedures. Typically in a free radical polymerization process, the monomers are polymerized in a solvent at an elevated temperature (about 50° C. to about 150° C.) in the presence of a free radical initiator. Suitable initiators include but are not limited to azo compounds and peroxides. Non-limiting examples of azo compounds include azobisisobutyronitrile (AIBN), (E)-dimethyl 2,2'-(diazene-1,2-diyl)bis(2-methylpropanoate) (AMMP), (E)-2,2'-(diazene-1, 2-diyl)bis(2,4-dimethylpentanenitrile (ADMPN), 1,1'-azobis (cyclohexanecarbonitrile) (ABCN), azobisisocapronitrile and azobisisovaleronitrile. Non-limiting examples of peroxides include hydrogen peroxide, tert-butylhydroperoxide, di-(tertiary)-butyl peroxide, benzoyl peroxide, lauryl peroxide, and methyl ethyl ketone peroxide. As noted, any of the other known initiators, including other azo compounds and peroxides can also be used in this polymerization process.

Suitable polymerization solvents for the aforementioned free radical polymerization reactions include hydrocarbon, haloalkane, ester ketone and aromatic solvents. Exemplary hydrocarbon solvents include but are not limited to alkanes and cycloalkanes such as pentane, hexane, heptane and cyclohexane. Exemplary haloalkane solvents include but or not limited to dichloromethane, chloroform, carbon tetrachloride, ethylchloride, 1,1-dichloroethane, 1,2-dichloroethane, 1-chloropropane, 2-chloropropane, 1-chlorobutane, 2-chlorobutane, 1-chloro-2-methylpropane, 1-chloropentane, Freon™ 112 halocarbon solvent. Exemplary ester solvents include but not limited to ethyl acetate, propyl acetate, butyl acetate and propylene glycol methyl ether ester (PGMEA), and the like and/or mixtures thereof. Exemplary ketone solvents include but not limited to acetone, 2-butanone (i.e., methyl ethyl ketone, MEK) and 2-heptanone, and the like and/or mixtures thereof. Exemplary aromatic solvents include but are not limited to benzene, toluene, xylene, mesitylene, chlorobenzene, and o-dichlorobenzene. Other organic solvents such as diethyl ether, tetrahydrofuran, lactones, and amides are also useful. Mixtures of one or more of the foregoing solvents can be utilized as a polymerization solvent. In some embodiments the solvents employed include cyclohexane, toluene, mesitylene, dichloromethane and 1,2-dichloroethane.

As noted, the polymer as obtained above is then subjected to suitable reaction conditions to ring open the maleic anhydride repeat units of formula (IIIC) with an amine of formula $R_{18}NH_2$, where $R_{18}$ is as defined herein. Any of the known methods which would bring about such a ring opening can be employed in this method of the invention. Non-limiting examples of such ring opening reactions include reacting the polymer with a desirable amount of an amine or ammonia itself when $R_{18}$ is hydrogen, at suitable reaction temperature for a desired length of time. If ammonia is the intended reactant, any equivalent thereof such as any ammonium salt can also be employed, including ammonium acetate, and the like. Non-limiting examples of amines include ammonia, methylamine, ethylamine, n-propylamine, iso-propylamine, n-butylamine, iso-butylamine, tert-butylamine, pentylamine, n-hexylamine, n-heptylamine, n-octylamine, n-dodecylamine, n-hexadecylamine, n-octadecylamine, and the like. Typically such amination reactions can be carried out at ambient, sub-ambient or super-ambient temperatures for a period of several minutes to several hours so as to result in desired amount of amination of the maleic anhydride unit to form either the amic-acid of formula (IIIA) or imide of formula (IIIB) or amic acid salt of formula (IIIE).

The aforementioned ring opening reactions can be carried out using any of the known methods in the art. Typically, such reactions are carried out in a suitable solvent or a mixture of solvents. Non-limiting examples of solvents include tetrahydrofuran (THF), acetonitrile, dimethylacetamide (DMAc), dimethyl sulfoxide (DMSO), N-methylpyrrolidone (NMP), ethyl acetate, methyl ethyl ketone (MEK), toluene, hexane, water, propylene glycol methyl ether acetate (PGMEA), γ-butyrolactone (GBL) and mixtures in any combination thereof. The reaction can be carried out at suitable temperature including ambient, sub-ambient and super-ambient conditions. Typically, the reaction temperature employed is in the range of about 20 to 120° C. and in certain embodiments the temperature can be in the range of 25 to 90° C. and in some other embodiments it can be in the range of 40 to 70° C. The reaction times can vary depending upon the type of polymers and the amine that is being reacted but can generally range from a period of from about 1 to 24 hours.

It should further be noted that the ring opening of maleic anhydride units of formula (IIIC) to form various species of formulae (IIIA), (IIIB), (IIID) or (IIIE) can also be controlled either during the formation of the polymer or during the use of such polymers in the compositions/formulations of this invention as further described herein. That is to say that the compositions of this invention can be tailored to obtain the desirable dissolution rate (DR) modification step to obtain desirable dissolution rate contrast of the exposed and unexposed regions of the film, this aspect becomes evident from the detailed discussion that follows and from the particular examples as specifically enumerated herein.

The ROMI polymers so formed in accordance with this invention, depending upon contacting with such aforementioned reagents will cause either complete or partial ring open of the maleic anhydride repeating units to form a repeat unit of formula (IIIA), (IIIB), (IIIE). Thus, such ROMI polymers may have a randomly ordered repeat units of formula (IA), (IIA) and (IIIA), (IIIB), (IIIE). Scheme I illustrates the ring opening pathway of an anhydride repeat units of formula (IIIC) to various other forms depending upon the reaction conditions and the type of polymers employed to form various ROMI polymers of this invention.

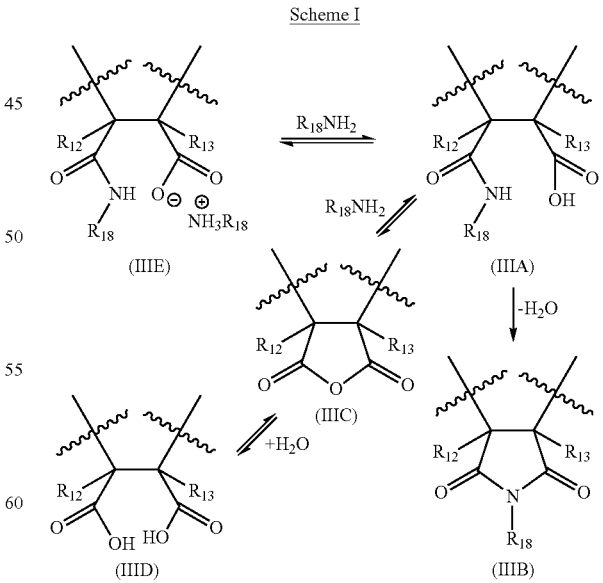

Scheme I

In Scheme I, in formulae (IIIA) through (IIIE) $R_{12}$, $R_{13}$ and $R_{18}$ are as defined herein. In Scheme I, the polymers formed from the polymerization of various monomers of formulae (I)

(II) and/or (IV) with maleic anhydride of formula (III), i.e., the polymers containing the repeat units of formula (IIIC) are treated with a suitable amine of formula $R_{18}NH_2$, where $R_{18}$ is as defined herein. As noted above, such reactions are generally carried out at ambient temperature or subjecting the appropriate reactants to certain desirable reaction temperature to form polymers having at least some portions of the repeat units of formula (IIIC) converted to repeat units of formula (IIIA). The polymers containing such repeat units of formula (IIIA) are further converted to polymers containing repeat units of formula (IIIB) or (IIIE). In addition, it is also contemplated that under such conditions portions of such repeat units are also converted to repeat units of formula (IIID). All of these transformations can be readily monitored by any of the known techniques in the art, such as for example, infrared spectroscopy. However, any of the other suitable techniques can be used to monitor the rate of formation of various different types of repeat units of formula (IIIA), (IIIB), (IIID) or (IIIE). It should further be noted that depending upon the reactions conditions employed, i.e., temperature and time of the reaction it is possible to control various ratios of the desired repeat units in the final polymer.

Accordingly, in some embodiments, the polymer of this invention encompasses a third type of repeat unit represented by formula (IIIA) derived from the monomer of formula (III):

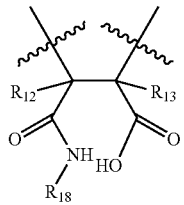

(IIIA)

wherein $R_{12}$ $R_{13}$ are as defined herein and $R_{18}$ is hydrogen, linear or branched $(C_1-C_{20})$alkyl, $(C_5-C_8)$cycloalkyl, $(C_6-C_{10})$aryl or $(C_7-C_{12})$aralkyl.

In some other embodiments, the polymer of this invention encompasses a third type of repeat unit represented by formula (IIIB) derived from the monomer of formula (III):

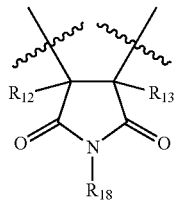

(IIIB)

wherein $R_{12}$ $R_{13}$ and $R_{18}$ are as defined herein.

In yet some other embodiments, the polymer of this invention encompasses a third type of repeat unit represented by formula (IIID) derived from the monomer of formula (III):

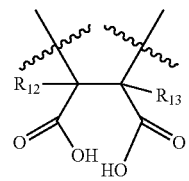

(IIID)

wherein $R_{12}$, $R_{13}$ and $R_{14}$ are as defined herein.

In yet some other embodiments, the polymer of this invention encompasses a third type of repeat unit represented by formula (IIIE) derived from the monomer of formula (III):

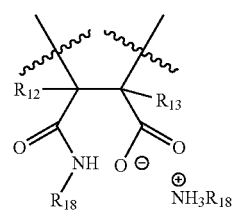

(IIIE)

wherein $R_{12}$, $R_{13}$ and $R_{14}$ are as defined herein.

In another embodiment of this invention the polymer of this invention encompasses one or more distinctive types of repeat units of formula (IA) derived from respective monomers of formula (I), where at least one of $R_1$, $R_2$, $R_3$ and $R_4$ independently represents a group of formula (A):

$$-SiR_5R_6R_7 \quad (A)$$

wherein:

$R_5$, $R_6$, and $R_7$ are the same or different and each independently of one other is selected from linear or branched $(C_1-C_6)$alkyl;

remaining one or more of $R_1$, $R_2$, $R_3$ and $R_4$ independently represents hydrogen, linear or branched $(C_1-C_{12})$alkyl, perfluoro$(C_1-C_{12})$alkyl, $(C_5-C_{10})$heteroaryl$(C_1-C_8)$alkyl, di$(C_1-C_2)$alkylmaleimide$(C_3-C_6)$alkyl, di$(C_1-C_2)$alkylmaleimide$(C_2-C_6)$alkoxy$(C_1-C_2)$alkyl, oxiranyl$(C_0-C_8)$alkyl, oxiranyl$(CH_2)_aO(CH_2)_b-$, or a group of formula (B):

$$-(CH_2)_a-(OCH_2-CH_2)_b-OR \quad (B)$$

wherein:
a is an integer 0, 1, 2, 3 or 4;
b is an integer 0, 1, 2, 3 or 4; and
R is linear or branched $(C_1-C_6)$alkyl; and
$R_{12}$ and $R_{13}$ are each hydrogen.

In another embodiment of this invention the polymer of this invention encompasses one or more distinctive types of repeat units of formula (IVA) derived from respective monomers of formula (IV), where:
n is an integer 0 or 1;
$R_{14}$, $R_{15}$, $R_{16}$ and $R_{17}$ independently represents hydrogen, linear or branched $(C_1-C_{16})$alkyl, perfluoro$(C_1-C_{12})$alkyl, $(C_6-C_{10})$aryl$(C_1-C_3)$alkyl, perfluoro$(C_6-C_{10})$aryl, $(C_5-C_{10})$heteroaryl$(C_1-C_8)$alkyl, oxiranyloxy$(C_1-C_3)$alkyl, oxiranyl$(C_0-C_8)$alkyl or a group of formula (B):

$$-(CH_2)_a-(OCH_2-CH_2)_b-OR \quad (B)$$

wherein:

a is an integer 0, 1, 2, 3 or 4;

b is an integer 0, 1, 2, 3 or 4; and

R is linear or branched $C_1$-$C_6$-alkyl.

Again, as noted above, various olefinic monomers of formula (II) can also be employed to prepare the polymers of this invention. Thus, in some embodiments, the polymer of this to invention encompasses one or more distinctive types of repeat units derived from respective monomers of formula (II) wherein: $R_8$, $R_9$, $R_{10}$ and $R_{11}$ are the same or different and each independently of one another is selected from hydrogen, methyl, ethyl, n-propyl, n-butyl, iso-butyl, tert-butyl, n-pentyl, iso-pentyl, neo-pentyl, phenyl, trimethylsilyl and triethylsilyl; or $R_8$ and $R_{10}$ are the same or different and each independently of one another is selected from hydrogen, methyl or ethyl; and $R_9$ taken together with $R_{11}$ and the carbon atoms to which they are attached form cyclohexyl, cycloheptyl or cyclooctyl ring. Representative examples of such cyclic olefins include without any limitation cyclopentene, cyclohexene, 1-methylcyclohex-1-ene, 3-methylcyclohex-1-ene, cycloheptene, cyclooctene, 1-ethylcyclohept-1-ene, 1-butyl-cyclooct-4-ene, and the like.

Various maleic anhydride-type monomers of formula (III), including maleic anhydride itself can be employed to make the polymers of this invention. Accordingly, in some embodiments, the polymer of this invention encompasses one or more distinctive types of repeat units of formula (IIIA), (IIIB), (IIIC), (IIID) and (IIIE) wherein: $R_{12}$ and $R_{13}$ are the same or different and each independently of one another is selected from hydrogen, methyl or ethyl; and $R_{14}$ is ($C_4$-$C_{18}$) alkyl. Exemplary amines that can be used to make the ROMI polymers of this invention include without any limitation n-butylamine, n-heptylamine, n-octylamine, n-dodecylamine, n-hexadecylamine, n-octadecylamine, and the like.

As noted, it is not necessary that only one type of monomer of formula (I) is employed to make a polymer containing a repeat unit of formula (IA). In fact, one or more monomers of formula (I) can be employed. Thus in some embodiments the polymer of this invention encompasses one or more first type of repeating units of formula (IA) derived from the respective monomers of formula (I). Accordingly, in some embodiments there is only one repeat unit of formula (IA), in some other embodiments there are at least two distinctive repeat units of formula (IA) and in some other embodiments there are three or more distinctive types of repeat units of formula (IA). In each case such repeat units are derived from the corresponding monomers of formula (I).

It should be further noted similarly that more than one type of monomer of formula (II) can be employed to make a polymer containing corresponding repeat units of formula (IIA). Thus, one or more monomers of formula (II) can be employed. Accordingly, in some embodiments, the polymer of this invention encompasses one or more second type of repeating units of formula (IIA) derived from the respective monomers of formula (II). Accordingly, in some embodiments there is only one repeat unit of formula (IIA), in some other embodiments there are at least two distinctive repeat units of formula (IIA) and in some other embodiments there are three or more distinctive repeat units of formula (IIA). In each case such repeat units are derived from the corresponding monomers of formula (II).

Similarly, more than one type of monomer of formula (IV) can be employed to make a polymer containing corresponding repeat units of formula (IVA). Thus, one or more monomers of formula (IV) can be employed. Accordingly, in some embodiments, the polymer of this invention encompasses one or more fourth type of repeating units of formula (IVA) derived from the respective monomers of formula (IV).

Accordingly, in some embodiments there is only one repeat unit of formula (IVA), in some other embodiments there are at least two distinctive repeat units of formula (IVA) and in some other embodiments there are three or more distinctive repeat units of formula (IVA). In each case such repeat units are derived from the corresponding monomers of formula (IV).

Representative examples of monomers of formula (I) from which repeat units of formula (IA) are derived include without any limitation the following:

bicyclo[2.2.1]hept-5-en-2-yltrimethylsilane;

bicyclo[2.2.1]hept-5-en-2-yltriethylsilane;

bicyclo[2.2.1]hept-5-en-2-yldimethyl-tert-butylsilane; and bicyclo[2.2.1]hept-5-en-2-yldimethylphenylsilane.

Representative examples of monomers of formula (II) from which repeat units of formula (IIA) are derived include without any limitation the following:

2-methylprop-1-ene;

2-methylpent-1-ene;

2,4,4-trimethylpent-1-ene;

2,4,4-trimethylpent-2-ene;

trimethyl(vinyl)silane; and styrene.

Representative examples of monomers of formula (IV) from which repeat units of formula (IVA) are derived include without any limitation the following:

bicyclo[2.2.1]hept-2-ene;

5-methylbicyclo[2.2.1]hept-2-ene;

5-ethylbicyclo[2.2.1]hept-2-ene;

5-hexylbicyclo[2.2.1]hept-2-ene;

5-octylbicyclo[2.2.1]hept-2-ene;

5-decylbicyclo[2.2.1]hept-2-ene;

5-((2-(2-methoxyethoxy)ethoxy)methyl)bicyclo[2.2.1]hept-2-ene;

1-(4-(bicyclo[2.2.1]hept-5-en-2-yl)butyl)-3,4-dimethyl-1H-pyrrole-2,5-dione;

2-((bicyclo[2.2.1]hept-5-en-2-ylmethoxy)methyl)oxirane; and 5-phenethylbicyclo[2.2.1]hept-2-ene Furthermore, as noted above, various ratios of different monomers can be employed to make the polymers of this invention. As already noted above, depending upon the nature of the monomers and their respective amounts employed, the resulting polymer may feature alternating monomeric repeat units or they can be randomly ordered. Accordingly, in some embodiments, the polymer of this invention encompasses 0 to 75 mole percent of first type of repeating units, 0 to 90 mole percent of second type of repeating units and 10 to 60 mole percent of third type of repeating units.

That is to say, in some embodiments, the polymer of this invention may contain only one or more repeating units of formula (IA) in combination with one or more repeat units of formula (IIIA), (IIIB), (IIIC), (IIID) or (IIIE). In such embodiments, the molar amount of repeat units of formula (IA) may be from 10 mole percent to 80 mole percent and the combined mole percent of repeat units of formula (IIIA) to (IIIE) may be from 20 to 90 mole percent, however, any other suitable mole percent of each of the repeat units that result in a polymer of this invention is also part of this invention. In some embodiments the mole percent of repeat units of formula (IA) and the combined mole percent of repeat units of formula (IIIA) through (IIIE) are each 50 mole percent. In some of these embodiments the individual mole percent of repeat units of formula (IIIE) can be from 25 to 30 mole percent based on the total mole percent of (IIIA) through (IIIE). The mole percent of repeat unit of formula (IIID) can range from 5 mole percent to 10 mole percent and in some other embodiments it is less than 5 mole percent. Similarly, the mole percent of repeat unit of formula (IIIE) can range from 5 mole percent to 10 mole percent and in some other embodiments it is less than 5 mole percent. As noted again the mole percent of each of the repeat units of formula (IIIA) through (IIIE) can be determined by any of the known methods in the art, for example, by infrared (IR) or nuclear magnetic resonance (NMR) spectroscopic techniques, among other techniques.

Furthermore, as noted above, various ratios of different monomers can be employed to make the polymers of this invention. As already noted above, depending upon the nature of the monomers and their respective amounts employed, the resulting polymer may feature alternating monomeric repeat units or they can be randomly ordered. Accordingly, in some embodiments, the polymer of this invention encompasses 0 to 75 mole percent of first type of repeating units, 0 to 90 mole percent of second type of repeating units and 10 to 60 mole percent of third type of repeating units.

That is to say, in some embodiments, the polymer of this invention may contain only one or more repeating units of formula (IA) in combination with one or more repeat units of formula (IIIA), (IIIB), (IIIC), (IIID) or (IIIE). In such embodiments, the molar amount of repeat units of formula (IA) may be from 10 mole percent to 80 mole percent and the combined mole percent of repeat units of formula (IIIA) to (IIIE) may be from 20 to 90 mole percent, however, any other suitable mole percent of each of the repeat units that result in a polymer of this invention is also part of this invention. In some embodiments the mole percent of repeat units of formula (IA) and the combined mole percent of repeat units of formula (IIIA) through (IIIE) are each 50 mole percent. In some of these embodiments the individual mole percent of repeat units of formula (IIIE) can be from 25 to 30 mole percent based on the total mole percent of (IIIA) through (IIIE). The mole percent of repeat unit of formula (IIID) can range from 5 mole percent to 10 mole percent and in some other embodiments it is less than 5 mole percent. Similarly, the mole percent of repeat unit of formula (IIIE) can range from 5 mole percent to 10 mole percent and in some other embodiments it is less than 5 mole percent. As noted again the mole percent of each of the repeat units of formula (IIIA) through (IIIE) can be determined by any of the known methods in the art, for example, by infrared (IR) or nuclear magnetic resonance (NMR) spectroscopic techniques, among other techniques.

In some other embodiments, the polymer of this invention may contain only one or more repeating units of formula (IIA) in combination with one or more repeat units of formula (IIIA), (IIIB), (IIIC), (IIID) or (IIIE). In such embodiments, the molar amount of repeat units of formula (IIA) may be from 20 mole percent to 80 mole percent and the combined mole percent of repeat units of formula (IIIA) to (IIIE) may be from 20 to 80 mole percent, however, any other suitable mole percent of each of the repeat units that result in a polymer of this invention is also part of this invention. In some of these embodiments the mole percent of repeat units of formula (IIA) and the combined mole percent of repeat units of formula (IIIA) through (IIIE) are each 50 mole percent. In some embodiments the individual mole percent of repeat units of formula (IIIE) can be from 25 to 30 mole percent based on the total mole percent of (IIIA) through (IIIE). The mole percent of repeat unit of formula (IIID) can range from 5 mole percent to 10 mole percent and in some other embodiments it is less than 5 mole percent. Similarly, the mole percent of repeat unit of formula (IIIE) can range from 5 mole percent to 10 mole percent and in some other embodiments it is less than 5 mole percent. As noted again the mole percent of each of the repeat units of formula (IIIA) through (IIIE) can be determined by any of the known methods in the art, for example, by infrared spectroscopic techniques.

Finally, in some embodiments, the polymer of this invention contains both repeating to units of formula (IA) and (IIA) in combination with one or more repeat units of formula (IIIA), (IIIB), (IIIC), (IIID) or (IIIE). In such embodiments, the molar amount of repeat units of formula (IA) may be from 5 mole percent to 40 mole percent, the molar amount of repeat units of formula (IIA) may be from 5 mole percent to 40 mole percent, and the combined mole percent of repeat units of formula (IIIA) to (IIIE) may be from 20 to 90 mole percent, however, any other suitable mole percent of each of the repeat units that result in a polymer of this invention is also part of this invention. In some embodiments the combined mole percent of repeat units of formula (IA) and (IIA), and the combined mole percent of repeat units of formula (IIIA) through (IIIE) are each 50 mole percent. In some embodiments the individual mole percent of repeat units of formula (IIIE) can be from 25 to 30 mole percent based on the total mole percent of (IIIA) through (IIIE). The mole percent of repeat unit of formula (IIID) can range from 5 mole percent to 10 mole percent and in some other embodiments it is less than 5 mole percent. Similarly, the mole percent of repeat unit of formula (IIIE) can range from 5 mole percent to 10 mole percent and in some other embodiments it is less than 5 mole percent. As noted again the mole percent of each of the repeat units of formula (IIIA) through (IIIE) can be determined by any of the known methods in the art, for example, by infrared spectroscopic techniques.

Further, non-limiting exemplary monomers that can be used to form the fourth type of repeating units in the polymers of this invention can be enumerated as follows:

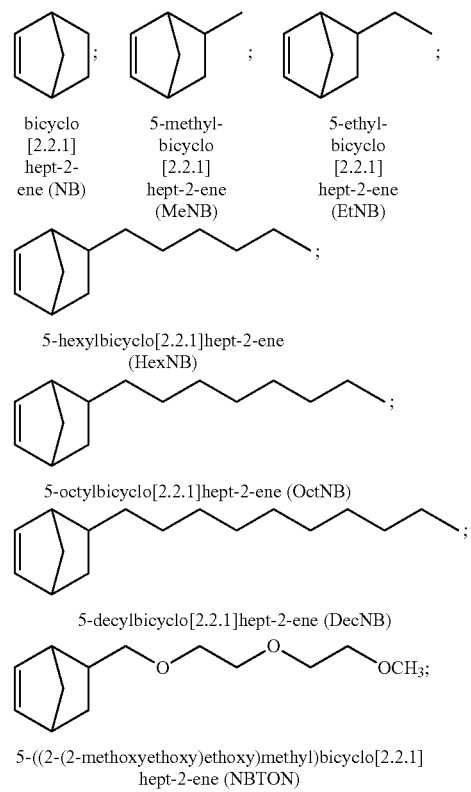

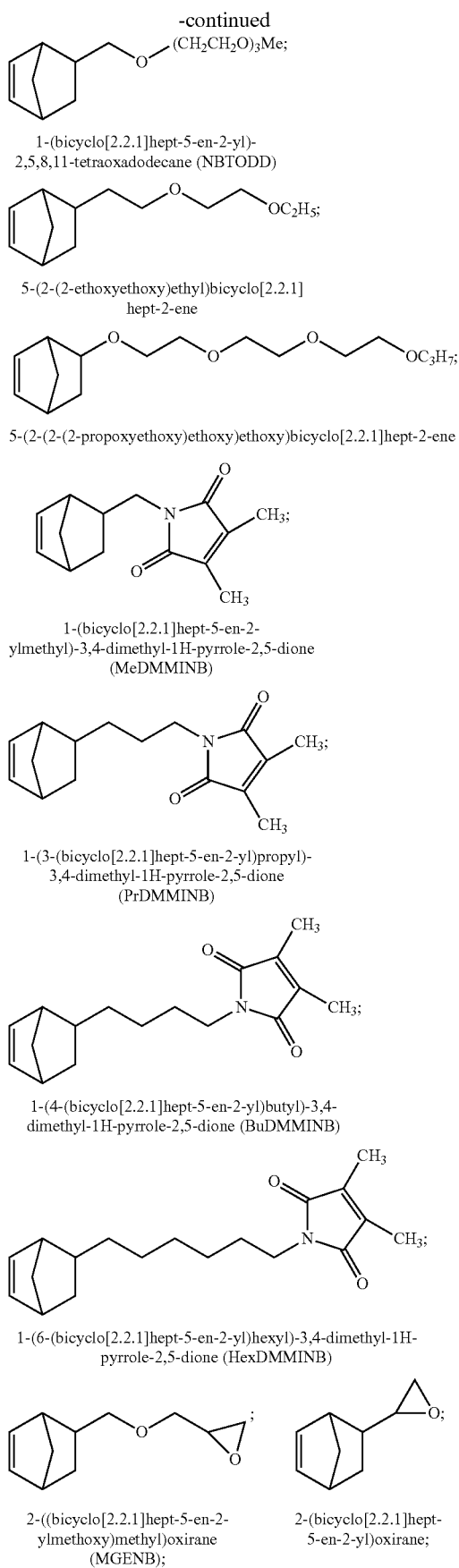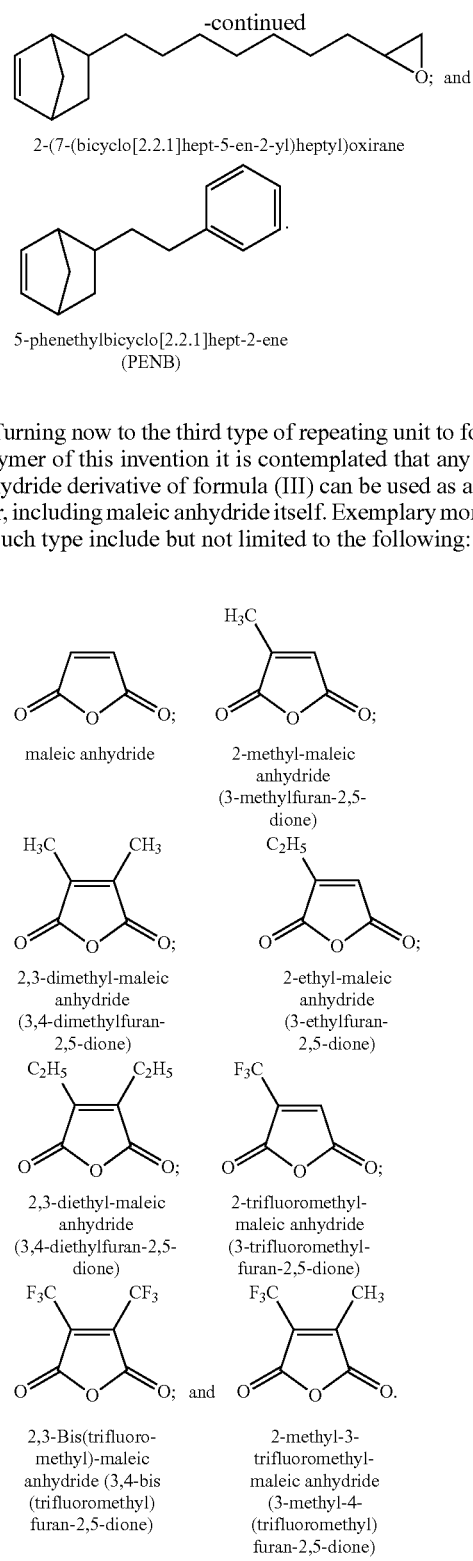

Turning now to the third type of repeating unit to form the polymer of this invention it is contemplated that any maleic anhydride derivative of formula (III) can be used as a monomer, including maleic anhydride itself. Exemplary monomers of such type include but not limited to the following:

Thus in accordance with another aspect of the embodiment of this invention, the combined amounts of the third type of repeat unit of formula (IIIA) through (IIIE), all of which are derived from the maleic anhydride type monomer of formula (III) is in the order of from about 1 mole percent to about 100 mole percent; in some other embodiments it is from about 20 mole percent to about 80 mole percent; in some other embodiments it is from about 40 mole percent to about 60 mole percent; and in some other embodiments it is from about 45 mole percent to about 55 mole percent. Further, as noted above, the specific amounts of repeat units of formula (IIIA) through (IIIE) depends upon various factors and depends upon the reaction conditions under which the polymer is subjected to as summarized in Scheme 1.

Advantageously, it has now been found that certain molar ratios of the repeat units of formulae (IIIA) thru (IIIE) may influence the properties of the compositions made therefrom for forming the photopatterned film layers of this invention as further described in detail below. Accordingly, in some embodiments the polymer of this invention contains at least about 1 mole percent of the repeat units of formula (IIIA) based on the total mole percent of the repeat units derived from monomer of formula (III), i.e., total mole percent of (IIIA) through (IIIE), in some other embodiments the mole percent of repeat units of formula (IIIA) is at least about 3% and in some other embodiments it is about at least 5%. In some other embodiments the mole percent of repeat units of formula (IIIA) can be in the range from about 1 to 60% or higher, 5 to 50%, 10 to 40%.

Similarly, in some other embodiments the polymer of this invention contains at least about 1 mole percent of the repeat units of formula (IIIB) based on the total mole percent of the repeat units derived from monomer of formula (III), i.e., total mole percent of (IIIA) through (IIIE), in some other embodiments the mole percent of repeat units of formula (IIIB) is at least about 2% and in some other embodiments it is about at least 5%. In some other embodiments the mole percent of repeat units of formula (IIIB) can be in the range from about 1 to 30% or higher, 2 to 25%, 5 to 20%.

In some other embodiments the polymer of this invention contains at least about 1 mole percent of the repeat units of formula (IIIC) based on the total mole percent of the repeat units to derived from monomer of formula (III), i.e., total mole percent of (IIIA) through (IIIE), in some other embodiments the mole percent of repeat units of formula (IIIC) is at least about 2% and in some other embodiments it is about at least 5%. In some other embodiments the mole percent of repeat units of formula (IIIB) can be in the range from about 1 to 30% or higher, 2 to 25%, 5 to 20%.

Finally, in some other embodiments any desirable amounts of the repeat units of formula (IIID) and (IIIE) can be present which can generally range from about 0% to 20% each, again based on the total mole percent of (IIIA) through (IIIE).

The ROMI polymers formed according to this invention generally exhibit a weight average molecular weight ($M_w$) of at least about 2,000. In another embodiment, the polymer of this invention has a $M_w$ of at least about 6,000. In yet another embodiment, the polymer of this invention has a $M_w$ of at least about 10,000. In some other embodiments, the polymer of this invention has a $M_w$ of at least about 25,000. The weight average molecular weight ($M_w$) of the polymers can be determined by any of the known techniques, such as for example, by gel permeation chromatography (GPC) using polystyrene standards.

Polymer Compositions/Applications

In another aspect of this invention there is also provided a photoimageable composition comprising:
a polymer containing:
a first type of repeating unit represented by formula (IA), said first type of repeating unit is derived from a monomer of formula (I):

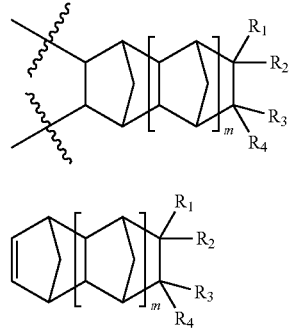

(IA)

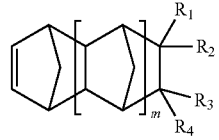

(I)

wherein:
m is an integer 0, 1 or 2;
at least one of $R_1$, $R_2$, $R_3$ and $R_4$ independently represents a group of formula (A):

—$SiR_5R_6R_7$ (A)

wherein:
$R_5$, $R_6$, and $R_7$ are the same or different and each independently of one another is selected from linear or branched ($C_1$-$C_6$)alkyl, ($C_5$-$C_8$)cycloalkyl, ($C_6$-$C_{10}$)aryl or ($C_7$-$C_{12}$)aralkyl;

remaining one or more of $R_1$, $R_2$, $R_3$ and $R_4$ independently represents hydrogen, linear or branched ($C_1$-$C_{16}$)alkyl, hydroxy($C_1$-$C_{16}$)alkyl, perfluoro($C_1$-$C_{12}$)alkyl, ($C_3$-$C_{12}$)cycloalkyl, ($C_6$-$C_{12}$)bicycloalkyl, ($C_7$-$C_{14}$)tricycloalkyl, ($C_6$-$C_{10}$)aryl, ($C_6$-$C_{10}$)aryl($C_1$-$C_3$)alkyl, perfluoro($C_6$-$C_{10}$)aryl, perfluoro($C_6$-$C_{10}$)aryl($C_1$-$C_3$)alkyl, ($C_5$-$C_{10}$)heteroaryl, ($C_5$-$C_{10}$)heteroaryl($C_1$-$C_8$)alkyl, hydroxy, ($C_1$-$C_{12}$)alkoxy, ($C_3$-$C_{12}$)cycloalkoxy, ($C_6$-$C_{12}$)bicycloalkoxy, ($C_7$-$C_{14}$)tricycloalkoxy, ($C_6$-$C_{10}$)aryloxy($C_1$-$C_3$)alkyl, ($C_5$-$C_{10}$)heteroaryloxy($C_1$-$C_3$)alkyl, ($C_6$-$C_{10}$)aryloxy, ($C_5$-$C_{10}$)heteroaryloxy, ($C_1$-$C_6$)acyloxy, halogen, di($C_1$-$C_2$)alkylmaleimide($C_3$-$C_6$)alkyl, di($C_1$-$C_2$)alkylmaleimide($C_2$-$C_6$)alkoxy($C_1$-$C_2$)alkyl, oxiranyl($C_0$-$C_8$)alkyl, oxiranyl($CH_2$)$_a$O($CH_2$)$_b$—, or a group of formula (B):

—$(CH_2)_a$—$(OCH_2$—$CH_2)_b$—OR (B)

wherein:
a is an integer 0, 1, 2, 3 or 4;
b is an integer 0, 1, 2, 3 or 4; and
R is linear or branched ($C_1$-$C_6$)alkyl, ($C_5$-$C_8$)cycloalkyl, ($C_6$-$C_{10}$)aryl or ($C_7$-$C_{12}$)aralkyl;
optionally a second type of repeating unit represented by formula (IIA), said second type of repeating unit is derived from a monomer of formula (II):

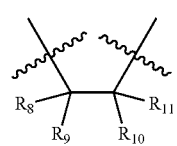

(IIA)

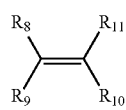

(II)

wherein
$R_8$, $R_9$, $R_{10}$ and $R_{11}$ are the same or different and each independently of one another is selected from hydrogen, linear or branched $(C_1-C_6)$alkyl, $(C_5-C_8)$cycloalkyl, $(C_6-C_{10})$aryl or $(C_7-C_{12})$aralkyl or a group of formula (C):

$$—SiR_5R_6R_7 \quad (C)$$

wherein:

$R_5$, $R_6$, and $R_7$ are the same or different and each independently of one other is selected from linear or branched $(C_1-C_6)$alkyl, $(C_5-C_8)$cycloalkyl, $(C_6-C_{10})$aryl or $(C_7-C_{12})$aralkyl; or one of $R_8$ or $R_9$ taken together with one of $R_{10}$ or $R_{11}$ and the carbon atoms to which they are attached form a $(C_5-C_8)$ cycloalkyl ring; and one or more of a third type of repeating unit represented by formulae (IIIA), (IIIB), (IIIC), (IIID) or (IIIE), said third type of repeating unit is derived from a monomer of formula (III):

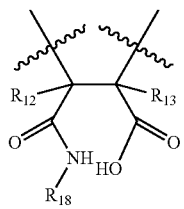
(IIIA)

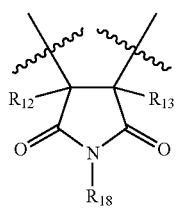
(IIIB)

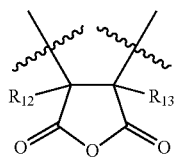
(IIIC)

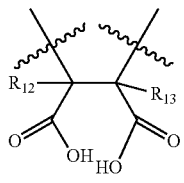
(IIID)

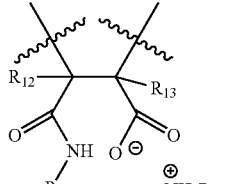
(IIIE)

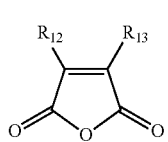
(III)

wherein:

$R_{12}$ and $R_{13}$ are each independently of one another represents hydrogen or linear or branched $(C_1-C_9)$alkyl or fluorinated or perfluorinated $(C_1-C_9)$alkyl;

$R_{18}$ is hydrogen, linear or branched $(C_1-C_{20})$alkyl, $(C_5-C_8)$ cycloalkyl, $(C_6-C_{10})$aryl or $(C_7-C_{12})$aralkyl; with the proviso that when there is only one of repeat unit of formulae (IIIA) through (IIIE) is present, then said one repeat unit is other than formula (IIIC); and wherein each of aforementioned groups, where valence is permissible, is optionally substituted with one or more groups selected from linear or branched $(C_1-C_6)$alkyl, $(C_3-C_7)$cycloalkyl, $(C_1-C_6)$perfluoroalkyl, $(C_1-C_6)$alkoxy, $(C_3-C_7)$cycloalkoxy, $(C_1-C_6)$perfluoroalkoxy, halogen, hydroxy, linear or branched hydroxy$(C_1-C_6)$alkyl, $(C_6-C_{10})$aryl or $(C_7-C_{12})$aralkyl; and optionally a fourth type of repeating unit represented by formula (IVA), said fourth type of repeating unit is derived from a monomer of formula (IV):

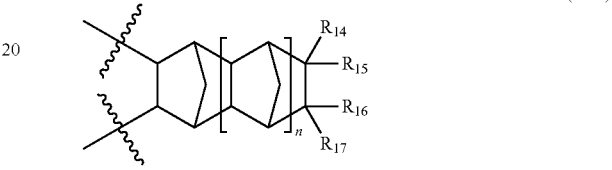
(IVA)

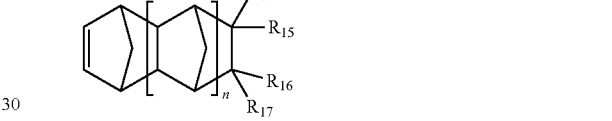
(IV)

wherein:

n is an integer 0, 1 or 2;

$R_{14}$, $R_{15}$, $R_{16}$ and $R_{17}$ independently represents hydrogen, linear or branched $(C_1-C_{16})$alkyl, hydroxy$(C_1-C_{16})$alkyl, perfluoro$(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl $(C_1-C_3)$alkyl, perfluoro$(C_6-C_{10})$aryl, perfluoro$(C_6-C_{10})$aryl $(C_1-C_3)$alkyl, $(C_5-C_{10})$heteroaryl, $(C_5-C_{10})$heteroaryl$(C_1-C_8)$alkyl, hydroxy, $(C_1-C_{12})$alkoxy, $(C_3-C_{12})$cycloalkoxy, $(C_6-C_{12})$bicycloalkoxy, $(C_7-C_{14})$tricycloalkoxy, $(C_6-C_{10})$ aryloxy$(C_1-C_3)$alkyl, $(C_5-C_{10})$heteroaryloxy$(C_1-C_3)$alkyl, $(C_6-C_{10})$aryloxy, $(C_5-C_{10})$heteroaryloxy, $(C_1-C_6)$acyloxy, halogen, di$(C_1-C_2)$alkylmaleimide$(C_3-C_6)$alkyl, di$(C_1-C_2)$ alkylmaleimide$(C_2-C_6)$alkoxy$(C_1-C_2)$alkyl, oxiranyloxy $(C_1-C_3)$alkyl, oxiranyl$(C_0-C_8)$alkyl, oxiranyl$(CH_2)_a$ $O(CH_2)_b$—, or a group of formula (B):

$$—(CH_2)_a—(OCH_2—CH_2)_b—OR \quad (B)$$

wherein:

a is an integer 0, 1, 2, 3 or 4;

b is an integer 0, 1, 2, 3 or 4; and

R is linear or branched $(C_1-C_6)$alkyl, $(C_5-C_8)$cycloalkyl, $(C_6-C_{10})$aryl or $(C_7-C_{12})$aralkyl.

a photoactive compound containing a diazo functional moiety; and a carrier solvent.

All of the polymers as described herein can be used in the photoimageable or photosensitive compositions of this invention. In some embodiments in accordance with the present invention the photosensitive polymer compositions contain co-, ter- or tetra-polymers encompassing one or more norbornene-type repeating units of formula (IA), optionally one or more other repeat units of formula (IIA) derived from various olefinic monomers as described herein, and one or more repeating units of formula (IIIA), (IIIB), (IIIC), (IIID)

or (IIIE) derived from maleic anhydride-type monomers and optionally one or more repeating units of formula (IVA) as described hereinabove and hereafter.

Representative examples of such polymers without any limitation may be enumerated as follows:

A copolymer containing repeating units derived from bicyclo[2.2.1]hept-5-en-2-yltrimethylsilane and maleic anhydride ring opened with n-octyl amine, n-dodecylamine, n-hexadecylamine or n-octadecylamine.

A terpolymer containing repeat units derived from bicyclo[2.2.1]hept-5-en-2-yltrimethylsilane, 1-(4-(bicyclo[2.2.1]hept-5-en-2-yl)butyl)-3,4-dimethyl-1H-pyrrole-2,5-dione and maleic anhydride ring opened with n-octyl amine, n-dodecylamine, n-hexadecylamine or n-octadecylamine.

A tetrapolymer containing repeat units derived from bicyclo[2.2.1]hept-5-en-2-yltrimethylsilane, 5-decylbicyclo[2.2.1]hept-2-ene; 1-(4-(bicyclo[2.2.1]hept-5-en-2-yl)butyl)-3,4-dimethyl-1H-pyrrole-2,5-dione and maleic anhydride ring opened with n-octyl amine, n-dodecylamine, n-hexadecylamine or n-octadecylamine.

A tetrapolymer containing repeat units derived from bicyclo[2.2.1]hept-5-en-2-yltrimethylsilane, 5-((2-(2-methoxyethoxy)ethoxy)methyl)bicyclo[2.2.1]hept-2-ene; 1-(4-(bicyclo[2.2.1]hept-5-en-2-yl)butyl)-3,4-dimethyl-1H-pyrrole-2,5-dione and maleic anhydride ring opened with n-octyl amine, n-dodecylamine, n-hexadecylamine or n-octadecylamine.

Such polymer compositions may further contain a photo active compound (PAC), optionally an epoxy resin and a solvent. Further, such compositions are capable of forming films useful as self-imageable layers in the manufacture of microelectronic and optoelectronic devices. That is to say that when image-wise exposed to actinic radiation, such layers (or films) can be developed to form a patterned film, where such pattern is reflective of the image through which the film was exposed.

In this manner, structures can be provided that are, or are to become, a part of such microelectronic and/or optoelectronic devices. For example, such films may be useful as low-K dielectric layers, including interlevel dielectrics, in liquid crystal displays or in microelectronic devices. Further, the embodiments as described fully herein can routinely provide films of 3 microns (μm) thickness or greater and images demonstrating aspect ratios in excess of 1:2 for isolated line/trench resolution in such films. Thus the films, layers, and structures formed from the polymer embodiments of the present invention are further useful for, among other things mentioned above, redistribution layers, stress buffer layers, leveling or planarization layers, alpha-particle barriers for both microelectronic and optoelectronic devices and the assemblies formed thereof, as well as adhesive bonding to form chip-stacks and to fixably attach transparent covers over image sensing arrays. It will be noted that such examples are only a few of the many uses for such a self-imageable film, and such examples do not serve to limit the scope of such films or the polymers and polymer compositions that are used to form them.

Advantageously, it has now been found that such polymer compositions containing one or more norbornene-type repeat units of formula (IA) and one or more of olefinic repeat units of formula (IIA) and/or one or more of olefinic repeat units of formula (IVA) and one or more of maleic anhydride derived repeat units of formula (IIIA) through (IIIE) provide several desirable properties. For instance, the maleimide-type pendent group containing repeat units of formula (IA) and/or (IVA), if present, may offer unique advantage of being both positive tone as well as negative tone image-wise photo-patterning of the films of this invention. In a negative tone photo-patterning the polymer composition may not need any of the other cross-linkers, such as multi-functional epoxy cross-linkers and/or photoactive compounds. That is to say, the "negative tone" photo imaging can be carried out exploiting the photo-curing ability of the "maleimide" functionality.

It should be noted that when the composition of this invention is intended to be a "negative tone" formulation, the polymer may additionally contain epoxy, hydroxy and/or such similar functional groups as pendent groups which are available for cross-linking with other ingredients in the formulation. For example, any of the monomers of formula (I) or (IV) having such functional groups as DMMI, oxirane, hydroxy, and the like are useful in forming the negative tone formulations of this invention. Typically, such negative tone formulations also contain photoacid generators (PAGs) that would bring about the cross-linking of the polymer composition when exposed to suitable radiation thus rendering exposed regions of the polymer film insoluble in the developing solvent.

Any of the PAGs known to one skilled in the art which would bring about the above noted result can be employed in this invention. Broadly speaking, the PAG that can be employed in this invention is a nucleophilic halogenide (e.g., diphenyliodonium salt, diphenylfluoronium salt) and complex metal halide anions (e.g., triphenylsulfonium salts). Exemplary PAGs without any limitation include, tetrakis (pentafluorophenyl)borate-4-methylphenyl[4-(1-methylethyl)phenyl iodonium (DPI-TPFPB), tris(4-tert-butyl)phenyl)sulfonium tetrakis-(pentafluorophenyl)borate (TTBPS-TPFPB), tris(4-tert-butyl)phenyl)sulfonium hexafluorophosphate (TTBPS-HFP), triphenylsulfonium triflate (TPS-Tf); triazine (TAZ-101); triphenylsulfonium hexafluoroantimonate (TPS-103); RHODOSIL™ Photoinitiator 2074 (FABA); triphenylsulfonium bis(perfluoromethanesulfonyl)imide (TPS-N1); di-(p-t-butyl)phenyliodonium bis(perfluoromethanesulfonyl)imide (DTBPI-N1); tris(perfluoromethanesulfonyl) methide (TPS-C1); di-(p-t-butylphenyl)iodonium tris(perfluoromethanesulfonyl)methide (DTBPI-C1); diphenyliodonium hexafluorophosphate, diphenyliodonium hexafluorostibate, bis(4-(tert-butyl)phenyl)iodonium hexafluorophosphate, bis(4-(tert-butyl)phenyl)iodonium hexafluorostibate (DTBPI-Tf), diphenyliodonium trifluoromethanesulfonate, diphenyliodonium 1,1,2,2,3,3,4,4,4-nonafluorobutane-1-sulfonate; bis(4-(tert-butyl)phenyl)iodonium trifluoromethanesulfonate; bis(4-(tert-butyl)phenyl)iodonium 1,1,2,2,3,3,4,4,4-nonafluorobutane-1-sulfonate; and combinations thereof.

Advantageously, as noted above, the compositions of this invention are also useful as "positive tone" photo-imaging by formulating differently with a suitable "photoactive compound" (PAC). By doing so, the photo curing effect of maleimide functionality, if present, is muted. That is to say, when maleimide type functional groups are present in the polymer, such as DMMI pendent groups, then PACs which are active at the wavelengths of radiation where DMMI functions are ineffective can be employed. Further, this can also be achieved by employing different sources of actinic radiation whereby only the PACs are active at those exposed wavelengths and/or at different exposure doses.

It has also been found that the polymer compositions of this invention provide several advantages in addition to being cost effective. Non-limiting examples of such additional advantages include for instance the compositions of this invention provide desirable dissolution rates (DR) when exposed to suitable radiation and developed thereafter. As used herein "DR" means the rate of film thickness loss when immersed or exposed to a suitable developer. Thus, for example, a dissolution rate of 100 nm/sec means that a film thickness of 100 nm is dissolved in a developer in one second. The developers can either be solvent based or aqueous based. Advantageously, it has now been found that the compositions of this invention can be developed using a variety of aqueous developers, such as for example, tetramethylammonium hydroxide (TMAH), among other aqueous developers. Generally, the compositions of this invention also feature desirable dark field loss (DFL) properties. As used herein, DFL means that the loss of film thickness of the unexposed regions of the film after "image-wise" exposure to a suitable radiation and development. It has now been found that the compositions of this invention feature very low DFL. In some embodiments, the compositions of this invention exhibit DFL of from about 2 percent to about 20 percent. In some other embodiments, the DFL is less than about 5 percent. That means that the loss of film thickness of the unexposed film regions is less than 5 percent. In addition, it has also been found that higher resolution of the images can be obtained from the compositions of this invention. In some embodiments, the resolution of images is as low as 5 μm and in some other embodiments the resolution of the images is about 10 μm. Among other advantageous properties it has also been observed that the compositions of this invention are readily curable after exposure to suitable radiation and developer. As a result, the resulting thermally cured film features certain desirable properties, for example, lower dielectric constant, among others.

Advantageously, it has also been found that the polymers of this invention exhibit excellent dissolution rate contrast (DR contrast) when used suitably in combination with the PAC. That is, the dissolution rate of the exposed regions are significantly different from that of the unexposed regions, thus providing high DR contrast, depending upon the type of polymer employed. The high DR contrast is desirable to obtain images of high resolution among various other advantages. Accordingly, in some embodiments of this invention there is provided a composition to obtain high dissolution rate contrast. In some other embodiments there is also provided a method of making compositions that are useful in forming images having low DFL.

It has also been found that the type of amine used to ring open the maleic anhydride repeat units tend to exhibit different DR properties. In general, it has now been found that the higher the alkyl chain employed, the resulting polymer exhibits low DR and thus good DR contrast. Accordingly, in some embodiments the $R_{18}$ may be an alkyl group having higher than 8 carbon atoms, for example, linear or branched ($C_8$-$C_{20}$)alkyl. In some other embodiments the $R_{18}$ may be an alkyl group having higher than 12 carbon atoms, for example, linear or branched ($C_{12}$-$C_{20}$)alkyl. In yet some other embodiments the Rig may be an alkyl group having higher than 16 carbon atoms, for example, linear or branched ($C_{16}$-$C_{20}$) alkyl.

Accordingly, in some embodiments the polymers of this invention exhibit a DR of at least 25 nm/sec when used in compositions of this invention as described herein. In some other embodiments the polymers encompassed in the compositions of this invention exhibit a DR in the range of from about 25 nm/sec to 300 nm/sec. As noted herein the desirable DR of a polymer encompassed in a composition depends upon the type of polymer employed and its dissolution properties. That is to say, when a polymer containing hydrophobic monomers are employed the DR of the composition formed therefrom can exhibit lower DR, such as for example, a DR of about 50 nm/sec. Whereas a composition formed from a polymer having hydrophilic functional group may exhibit a high DR of about 200 nm/sec. Therefore, all such polymers and compositions formed therefrom are within the scope of this invention.

In addition, it has also been observed that the films formed from the compositions of this invention also exhibit different properties when exposed to solvents. For example, generally it has been observed that the swelling of the film can be controlled by increasing the number of carbon atoms on the alkyl chain of the film. That is, higher the alkyl chain lower the swelling of the film.

Further, it has also been found that proper utilization of one or more monomers of formula (I), one or more monomers of formula (II) and one or more monomers of formula (III), and upon suitable ring opening and/or transformation of the maleic anhydride repeat units, it is now possible to form a polymer which can be formulated to form films having desirable properties. For instance, it has now been found that proper tailoring of the ratios of monomers utilized and the respective chemical structures of formulae (I), (II), (III) or (IV) it is possible to tailor a polymer having very low dielectric constant. In addition, various other additives, such as PACs or cross-linkers, can either be eliminated and/or reduced thus offering not only simplified formulations but also significant property advantages as well as cost savings. Most notable advantages being the compositions of this invention can be formulated into positive tone compositions which can be photo-cured with or without a cross-linker or a photo-sensitizer (i.e., a PAC). Similarly the compositions of this invention can be thermally cured with or without an epoxy cross-linker, thus offering lower dielectric constant photo and/or thermally cured films.

Non-limiting examples of suitable photoactive compounds (PACs) that can be employed in these photosensitive compositions encompass a photoactive group, such as, a diazo functional moiety, including but not limited to 1,2-naphthoquinonediazide-5-sulfonyl moiety of formula (V), a 1,2-naphthoquinonediazide-4-sulfonyl moiety of the formula (VI) or a 1,2-quinonediazide-4-sulfonyl moiety of the formula (VII):

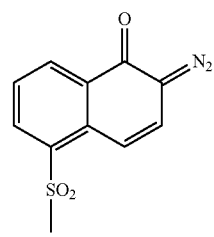
(VI)

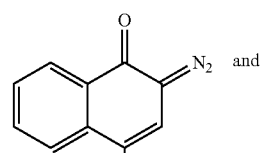
(VI)

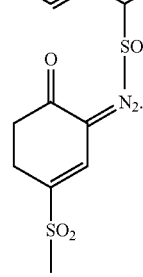
(VII)

It should further be noted that any of the PACs that encompass above noted diazo functional moiety can be used in this invention. Exemplary PACs include without any limitation the following:

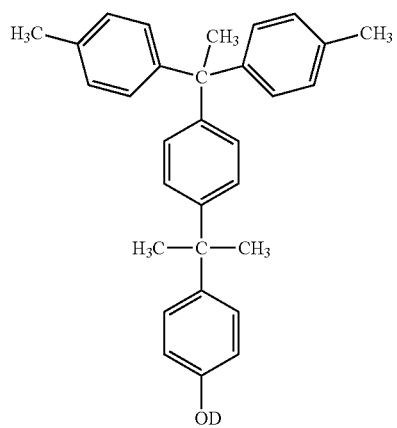
(VIIIa)
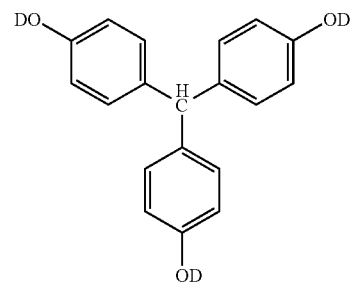
(VIIIb)
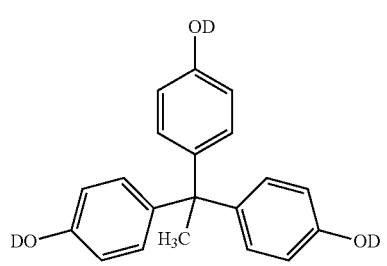
(VIIIc)
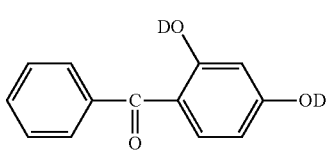
(VIIId)
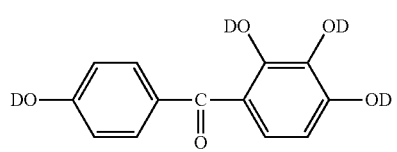
(VIIIe)
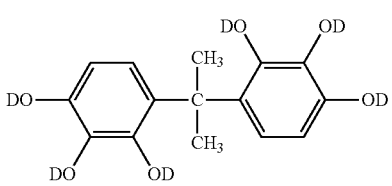
(VIIIf)
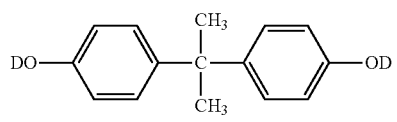
(VIIIg)
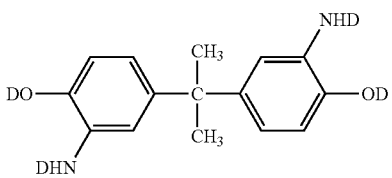
(VIIIh)
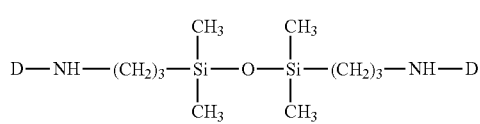
(VIIIi)
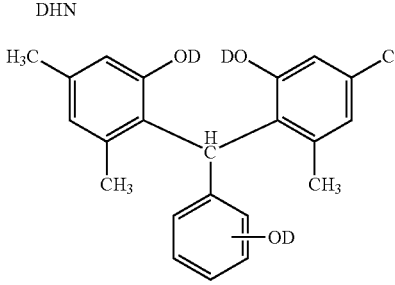
(VIIIj)
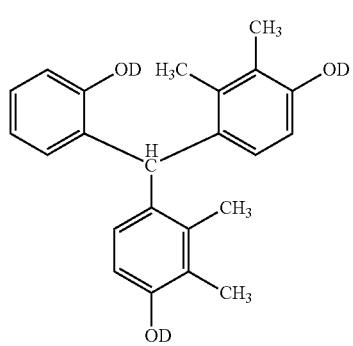
(VIIIk)
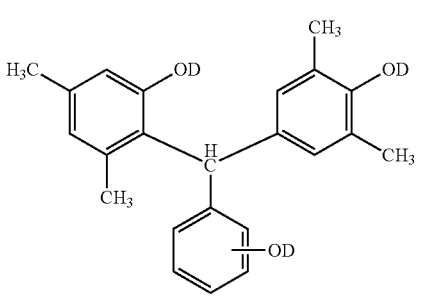
(VIIIl)

-continued
(VIIIm)
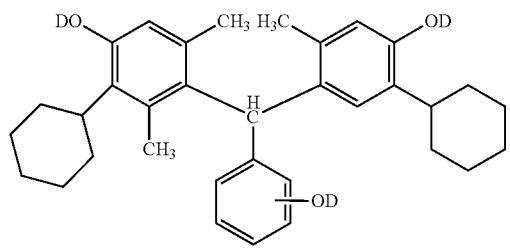
(VIIIn)
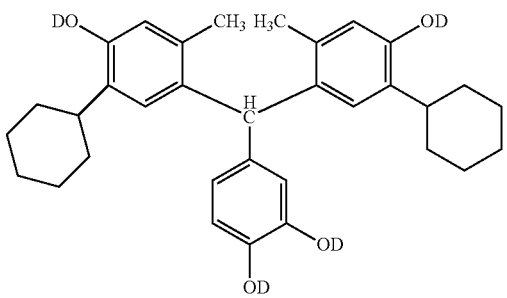
(VIIIo)
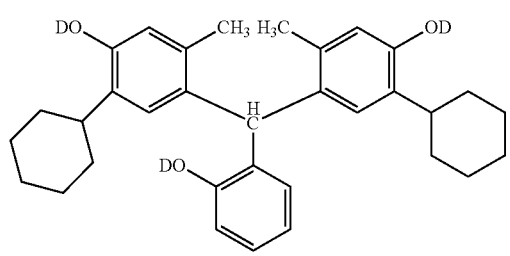
(VIIIp)
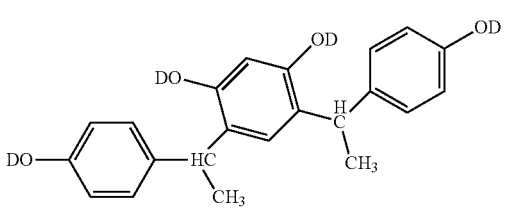
(VIIIq)
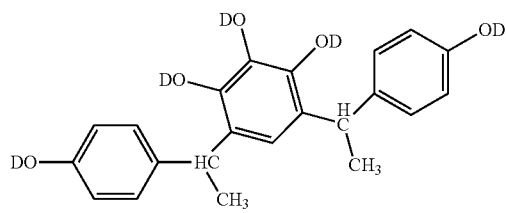
(VIIIr)
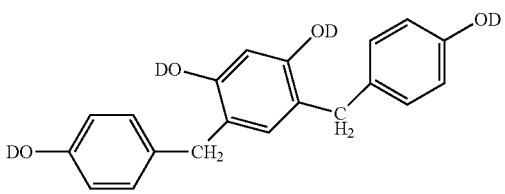
(VIIIs)
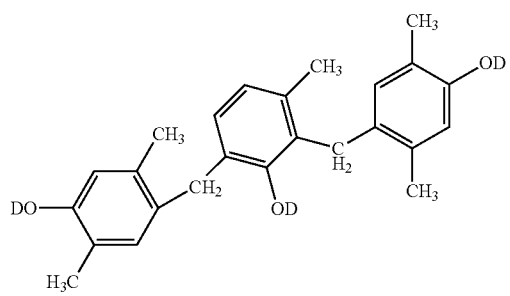
(VIIIt)
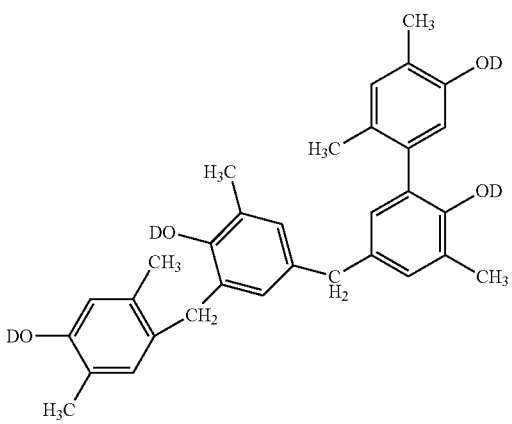

-continued
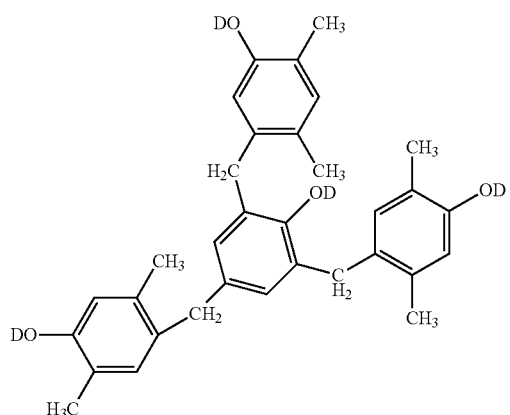
(VIIIu)
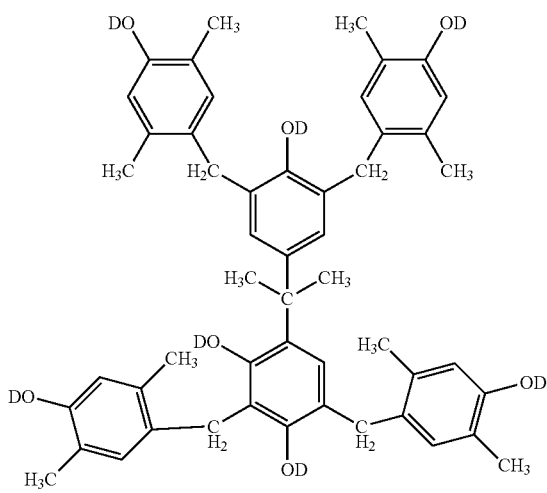
(VIIIv)
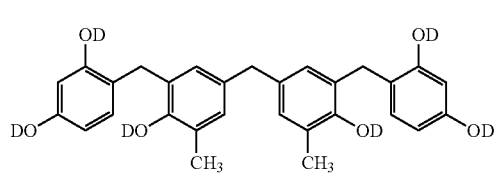
(VIIIw)
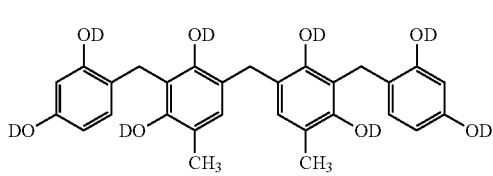
(VIIIx)
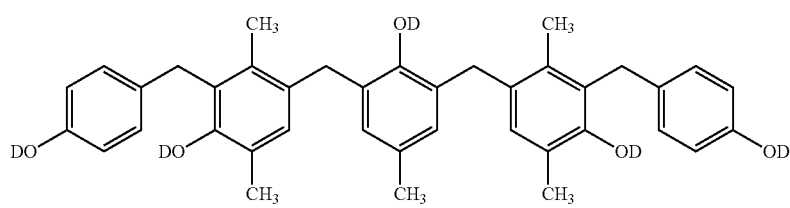
(VIIIy)
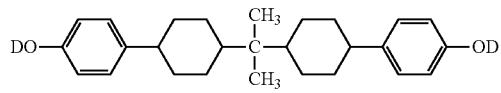
(VIIIz)
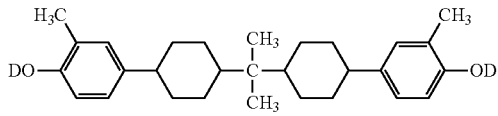
(VIIIaa)
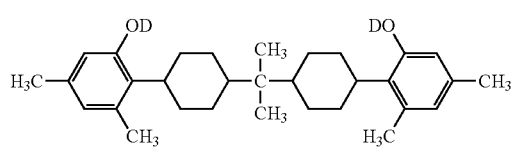
(VIIIab)
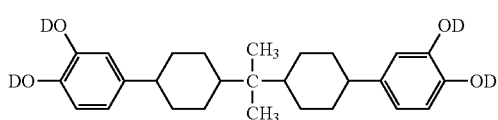
(VIIIac)
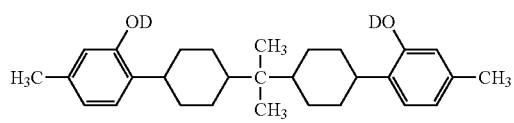
(VIIIad)
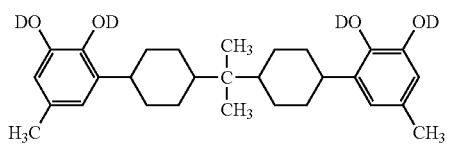
(VIIIae)
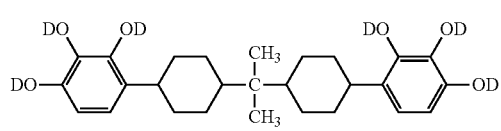
(VIIIaf)
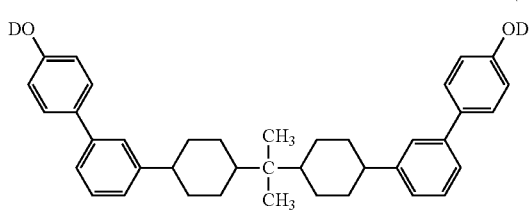
(VIIIag)

Where at least one D is a diazo functional moiety of formula (V), (VI) or (VII) and the remainder Ds are hydrogen. That is to say at least one of D is a diazo functional moiety of formula (V), (VI) or (VII). However, it should be noted that certain of the PACs, including some commercially available PACs, contain only some portions of Ds replaced with hydrogen. That is, even if the PAC contains only one D, only some portions of D in such a PAC is replaced with a diazo functional moiety, such as for example only 50 percent of D is a diazo functional moiety. Similarly, if the PAC contains more than one D it is not necessary that whole portions of one or more D has to be replaced with a diazo functional group. For example, as further described below, certain of the commercially available PACs contain partial substitution of one or more of these diazo functional moieties. Various additional useful photoactive compounds are exemplified in U.S. Pat. No. 7,524,594 B2 columns 14-20, pertinent portions of which are incorporated herein by reference Generally the diazo functional groups of formulae (V), (VI) and/or (VII) are incorporated into the photosensitive composition as an esterification product of the respective sulfonyl chloride (or other reactive moiety) and a phenolic compound, such as one or more of the exemplary compounds enumerated herein collectively as structural formulae (VIIIa) to (VIIIag). Also exemplified herein are the sulfonamide analogs which are formed by the reaction of respective sulfonyl chlorides with an amine such as phenyl amine and/or various other amines, see for example structural formulae (VIIIh) and (VIIIi). Thus, any one, or any mixture of two or more of such esterification products (or amide products) are combined with the resin in forming the photosensitive resin compositions of the present invention. In the formulae (VIII), D may represent any of the structures (V), (VI) or (VII). Such photoactive compounds (PACs) are known to undergo photo-rearrangement when subjected to actinic (or electromagnetic) radiation of suitable wavelength, such as for example 254, 365, 405, or 436 nm. Depending upon the nature of the PAC employed the wavelength of the radiation can be modified by employing suitable light source. Accordingly, when a portion of a film or a layer of the photosensitive composition is exposed to appropriate electromagnetic or actinic radiation, these diazo products undergo rearrangement to ultimately generate a carboxylic acid which enhances the solubility of such exposed portion in an aqueous alkali solution as compared to any unexposed portions of such film. Generally such photosensitive materials are incorporated into the composition in an amount from 1 to 50 parts per hundred parts by mass (pphr) of the polymer or resin as described herein. In some other embodiments such amount can range from 5 to 30 pphr. In yet other embodiments such amount can range from 10 to 20 pphr. It should further be noted that the specific ratio of the photosensitive material to resin employed is a function of the dissolution rate of exposed portions as compared to unexposed portions and the amount of radiation required to achieve a desired dissolution rate differential. That is, it is now possible to tailor a photosensitive composition based upon the type of polymer and the type of PAC employed, which results in optimal dissolution rate at a given dose of radiation and the frequency of such radiation employed, thereby achieving surprisingly high resolution photopatterns on a film exhibiting excellent chemical, mechanical, electrical and optoelectronic properties.

Several of the PACs enumerated as herein are commercially available. For example, PAC-5570 of formula (VIIIc) (St. Jean Photochemicals Inc., Quebec, Canada), SCL6 of formula (VIIId) (Secant Chemicals Inc., Winchendon, Mass., USA), Tris-P 3M6C-2-201 of formula (VIIIo) (also referred to herein as TrisP), collectively TS-200, TS-250 and TS-300 of formula (VIIIa), and 4NT-300 of formula (VIIIe) (all from Toyo Gosei Co. Ltd., Chiba, Japan). It should be noted that for PACs of the types TS-200, TS-250 and TS-300, the degree of substitution of Ds also varies based on the product used. For instance, TS-200 is substituted with 67% of D, TS-250 is substituted with 83% of D, and TS-300 with 100% of D, the unsubstituted portion being hydrogen.

In some embodiments of this invention the following PACs are used:

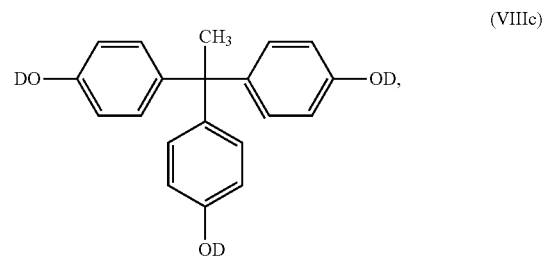

(VIIIc)

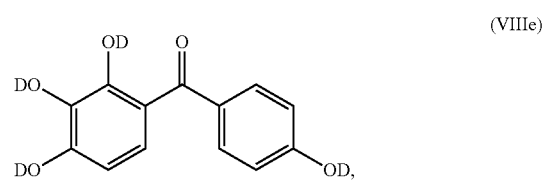

(VIIIe)

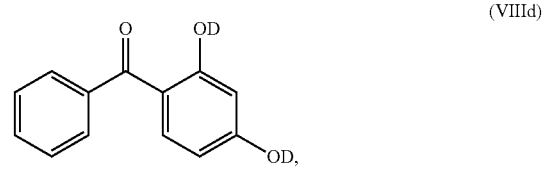

(VIIId)

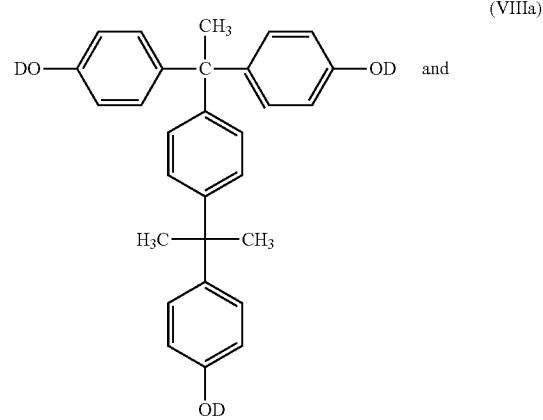

(VIIIa) and

-continued

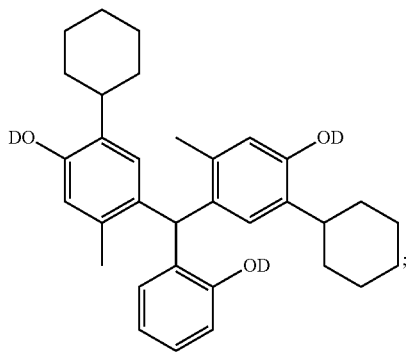

(VIIIo)

Wherein, as noted above, at least one D is a diazo functional moiety of formula (V), (VI) or (VII) and the remainder Ds are hydrogen. In some of these embodiments at least some of the D is a diazo functional moiety of formula (V) or (VI) and the remainder Ds are hydrogen.

In another embodiment the PAC used is a compound of the formula (VIIIp):

weight, although other advantageous amounts of such materials are also appropriate and within the scope of the present invention. Generally, lesser amount of PAG is used in a "negative tone" composition, and can be optional, i.e., depending upon the type of polymer used there may not be a need to use any additional PAG in such compositions. However, for "positive tone" compositions the PAC is always used and the amount can range from about 1 to 50 pphr of the polymer and typically from about 5 to about 30 pphr. As used herein, "positive tone" compositions means that after "image-wise" exposure, the development process removes only the exposed portions of the film thus leaving a positive image of the masking layer in the film. For the "negative tone" compositions, such development process removes only unexposed portions of the film thus leaving a negative image of the masking layer in the film.

The compositions of this invention can be prepared using any of the known carrier solvents, all such solvents are within the scope of this invention. Non-limiting exemplary one or more of such carrier solvents can be selected from the group consisting of: cyclohexanone, cyclopentanone, diethylene glycol dimethyl ether, propylene glycol monomethyl ether acetate (PGMEA), N-methyl-2-pyrrolidone (NMP), gamma-

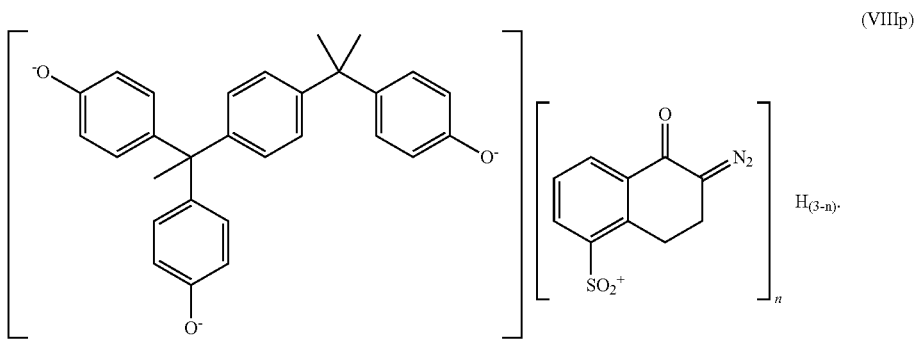

(VIIIp)

Where n can be 0, 1, 2 or 3. In some embodiments, the PAC used is a compound of the formula (VIIIp) designated as PA-28, where n is 2.8.

It should further be noted that polymers as described herein may also be suitable for forming "negative tone" compositions. Accordingly, the amount of photo active compounds, such as PACs, incorporated into the polymer compositions depends upon the type of polymer used and to the type of exposure contemplated, i.e., "positive tone" or "negative tone" compositions. As already discussed above the amount of PAGs can vary and generally for "negative tone" compositions it can range from about 0.1 to 20 parts by weight of the polymer to and typically from about 0.5 to about 10 parts by weight, and in some embodiments from about 1 to 5 parts by butyrolactone (GBL), N,N-dimethylacetamide, N,N-dimethylformamide, anisole, acetone, methyl 3-methoxypropionate and tetrahydrofuran (THF). Again, as noted above, as one of ordinary skill in the art readily appreciates, mixtures in any combination of two or more of these solvents can also be employed.

In one of the embodiments, the composition of this invention encompasses a carrier solvent which is selected from the group consisting of: propylene glycol monomethyl ether acetate (PGMEA), N-methyl-2-pyrrolidone (NMP), gamma-butyrolactone (GBL) and mixtures in any combination thereof.

The compositions of this invention further comprise one or more optional components including without any limitation cross-linking agents, and the like. Examples of such other optional components may include without any limitation one or more compounds/various additives such as surfactants, silane coupling agents, leveling agents, antioxidants, flame retardants, plasticizers, curing accelerators, sensitizer components, solvents, catalyst scavengers, adhesion promoters, stabilizers, reactive diluents and dissolution promoters.

Any of the cross-linking agents which brings about the cross-linking of the compositions of this invention after exposure of the film and developing can be used in this invention and are within the scope of this invention. For example, various epoxy compounds are useful as cross-linking agents. Exemplary epoxies and other cross-linking additives, include, but are not limited to, bisphenol A epoxy resin (LX-01, Daiso Chemical Co., Osaka, Japan), 2,2'-((((1-(4-(2-(4-(oxiran-2-ylmethoxy)phenyl)propan-2-yl)phenyl)ethane-1,1-diyl)bis(4,1-phenylene))bis(oxy))bis(methylene))bis(oxirane) (Techmore VG3101L, Mitsui Chemical Inc.), trimethylolpropane triglycidylether (TMPTGE-CVC Specialty Chemicals, Inc.), and 1,1,3,3,5,5-hexamethyl-1,5-bis(3-(oxiran-2-ylmethoxy)propyl)trisiloxane (DMS-E09, Gelest, Inc.)

In some embodiments the composition of this invention comprises one or more cross-linking agents which can be selected without any limitation from the group consisting of:

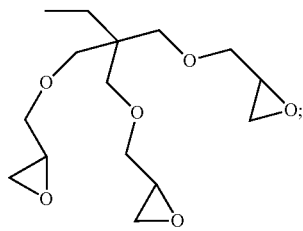

2,2'-(((2-ethyl-2-((oxiran-2-ylmethoxy)methyl)propane-1,3-diyl)bis(oxy))-bis(methylene))bis(oxirane)
(TMPTGE)

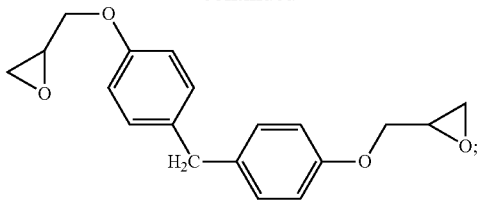

bis(4-(oxiran-2-ylmethoxy)phenyl)methane (EPON™ 862)

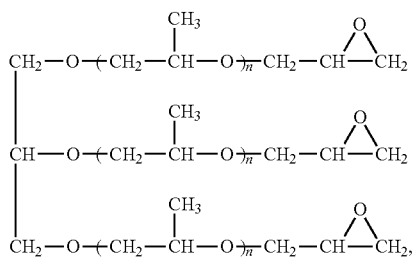

polyglycidyl ether of an aliphatic triol
(HELOXY™ 84 or GE-36)

where n is believed to be about 8;

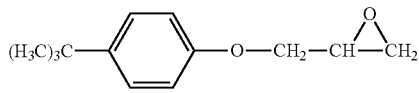

glycidyl ether of para-tertiary
butyl phenol (HELOXY™ 65);

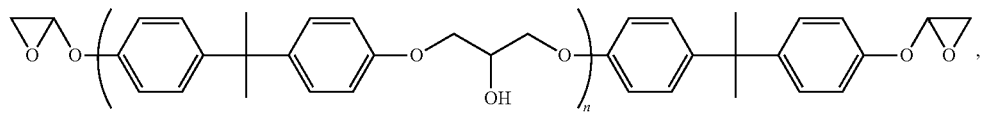

LX-01 where n is believed to range from 10 to 100 or higher;

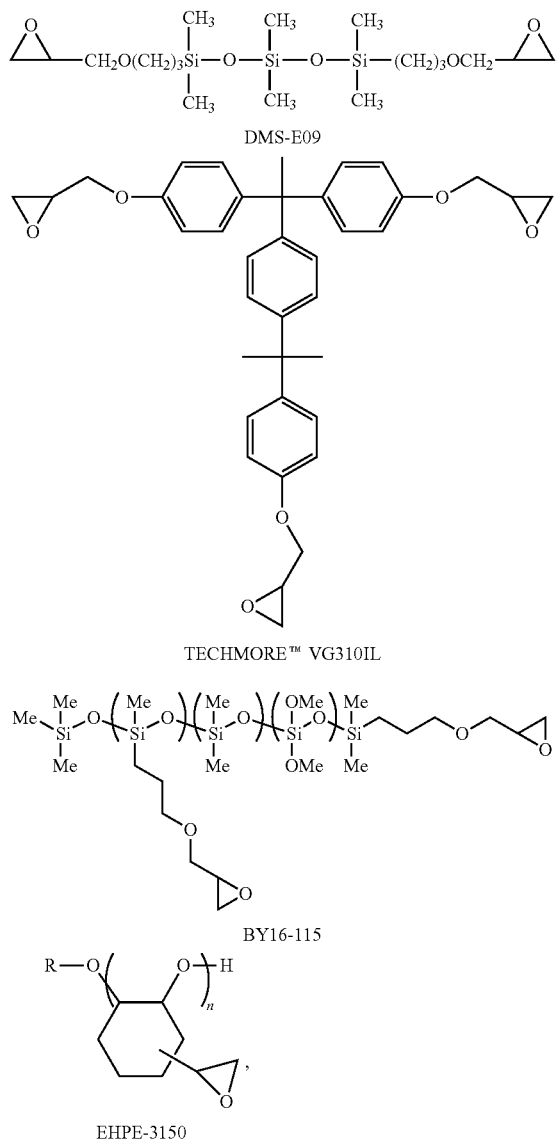

where n is believed to be around 10

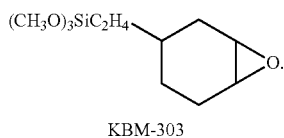

KBM-303

Other cross-linking agents that can be employed in the compositions also include without any limitation the following: polyethylene glycol diglycidyl ether (PEGDGE); and polypropylene glycol diglycidyl ether (PPGDGE). Still other exemplary epoxy resins or cross-linking additives include, among others Araldite MTO163 and Araldite CY179 (manufactured by Ciba Geigy); and EHPE-3150, Epolite GT300 and (manufactured by Daicel Chemical). It should further be noted that any of the cross-linking agents as described herein can be used alone or as mixtures of one or more cross-linking agents in any combination thereof.

The amount of epoxy compound may also vary as noted for PACs, and in certain instances the epoxy used can be optional especially in the case of a "negative tone" compositions, as noted above. The amount can vary generally from about 0 to 50 parts by weight of the polymer and typically from about 2 to about 30 parts by weight, although other advantageous amounts of such materials are also appropriate and within the scope of the present invention.

Where appropriate, any suitable sensitizer component can be included in the polymer compositions of the present invention. Such suitable sensitizer components include, but are not limited to, anthracenes, phenanthrenes, chrysenes, benzpyrenes, fluoranthenes, rubrenes, pyrenes, xanthones, indanthrenes, thioxanthen-9-ones, and mixtures thereof. In some exemplary embodiments, suitable sensitizer components include 2-isopropyl-9H-thioxanthen-9-one, 4-isopropyl-9H-thioxanthen-9-one, 1-chloro-4-propoxythioxanthone (commercially sold under the name CPTX from Lambson), phenothiazine, OMNIPOL™ TX (from IGM Resins) and mixtures thereof.

In some embodiments, the composition of this invention encompasses one or more cross-linking agents selected from the group consisting of: 2,2'-(((2-ethyl-2-((oxiran-2-ylmethoxy)methyl)propane-1,3-diyl)bis(oxy))-bis(methylene))bis(oxirane) (TMPTGE); bis(4-(oxiran-2-ylmethoxy)phenyl)methane (EPON 862); or polyglycidyl ether of an aliphatic triol (HELOXY 84 or GE-36). Again, as noted above, mixtures of these cross-linking agents in any combination thereof can also be used.

The polymer compositions in accordance with the present invention may further contain optional components as may be useful for the purpose of improving properties of both the composition and the resulting layer, for example the sensitivity of the composition to a desired wavelength of exposure radiation. Such additives include, but are not limited to, bisphenol A and 5-norbornene-2,3-dicarboxylic acid as a dissolution promoter, a silicone surfactant such as TSF4452 (Toshiba Silicone Co., Ltd), a silane coupling agent such as γ-aminopropyl triethoxysilane, a leveling agent, such as γ-(methacryloyloxy propyl)trimethoxysilane, antioxidants such as IRGANOX™ 1035 and 1076 (Ciba Specialty Chemicals), a fire retardant such as a trialkyl phosphate or other organic phosphoric compound, a plasticizer such as, poly (propylene glycol) and a crosslinking agent such as a multifunctional epoxy compound, or a bifunctional, sulfur containing organosilane, bis(triethoxysilylpropyl)disulfide, commonly available commercially as Si 75®.

In some embodiments of this invention the photosensitive composition encompass one or more polymers selected without any limitation from the group consisting of:

a copolymer containing repeating units derived from bicyclo[2.2.1]hept-2-ene (NB) and maleic anhydride ring opened with n-octyl amine, n-dodecylamine, n-hexadecylamine or n-octadecylamine; and a copolymer containing repeat units derived from styrene and maleic anhydride ring to opened with n-octyl amine, n-dodecylamine, n-hexadecylamine or n-octadecylamine.

In some embodiments of this invention, the semiconductor device encompassing a redistribution layer (RDL) structure further incorporates a photosensitive composition according to this invention.

In addition, in some embodiments of this invention as described above, a film is formed by the photosensitive composition according to this invention. As further described above, such films generally exhibit excellent chemical, mechanical, elastic properties having a wide variety of utility in electronic, optoelectronic, microelectromechanical applications featuring excellent dielectric properties.

Accordingly, in some embodiments of this invention, there is provided a microelectronic or optoelectronic device encompassing one or more of a redistribution layer (RDL) structure, a chip-stack structure, a CMOS image sensor dam structure, where said structures further incorporates a photosensitive composition according to this invention.

Further, in some embodiments of this invention, there is provided a method of forming a film for the fabrication of a microelectronic or optoelectronic device comprising:

coating a suitable substrate with a composition according to the invention to form a film;

patterning the film with a mask by exposing to a suitable radiation;

developing the film after exposure to form a photo-pattern; and curing the film by heating to a suitable temperature.

The coating of the desired substrate to form a film with photosensitive composition of this invention can be performed by any of the coating procedures as described herein and/or known to one skilled in the art, such as by spin coating. Other suitable coating methods include without any limitation spraying, doctor blading, meniscus coating, ink jet coating and slot coating. Suitable substrate includes any appropriate substrate as is, or may be used for electrical, electronic or optoelectronic devices, for example, a semiconductor substrate, a ceramic substrate, a glass substrate.

Next, the coated substrate is first softbaked before the curing, i.e., heated to facilitate the removal of residual casting solvent, for example to a temperature from 60° C. to 150° C. for from about 1 to 30 minutes, although other appropriate temperatures and times can be used. In some embodiments the substrate is first softbaked before the curing at a temperature of from about 70° C. to about 130° C. for 2 minutes to 10 minutes. After the heating, the film is generally imagewise exposed to an appropriate wavelength of actinic radiation, wavelength is generally selected based on the choice of the photoactive compound and/or photosensitizer incorporated into the polymer composition as described herein. However, generally such appropriate wavelength is that produced by a mercury vapor lamp which is from 200 to 600 nm depending upon the type of mercury vapor lamp employed. It will be understood that the phrase "imagewise exposure" means exposing through a masking element to provide for a resulting pattern of exposed and unexposed portion of the film.

After an imagewise exposure of the film formed from photosensitive composition or formulation embodiments in accordance with the present invention, a development process is employed. For the positive tone polymer formulations of the present invention, such development process removes only exposed portions of the film thus leaving a positive image of the masking layer in the film. For the negative tone polymer formulations of the present invention, such development process removes only unexposed portions of the film thus leaving a negative image of the masking layer in the film. For some embodiments, a post exposure bake can be employed prior to the aforementioned development process similar to the hardbake step described above.

Suitable developers, particularly for positive tone formulations, can include aqueous solutions of inorganic alkalis such as sodium hydroxide, potassium hydroxide, sodium carbonate, ammonia, and aqueous solutions of organic alkalis such as 0.26N tetramethylammonium hydroxide (TMAH), ethylamine, triethylamine and triethanolamine. Where an organic alkali is used, generally an organic solvent essentially fully miscible with water is used to provide adequate solubility for the organic alkali. Aqueous solutions of TMAH are well known developer solutions in the semiconductor industry. Suitable developers can also include organic solvents such as PGMEA, 2-heptanone, cyclohexanone, toluene, xylene, ethyl benzene, mesitylene and butyl acetate, among others, or mixtures of these solvents in any combination thereof.

Thus some formulation embodiments of the present invention provide self-imageable films that after imagewise exposure, a resulting image is developed using an aqueous base solution, while for other such embodiments a resulting image is developed using an organic solvent. Regardless of which type of developer is employed, after the image is developed, the substrate is rinsed to remove excess developer solution, typical rinse agents are water or appropriate alcohols and mixtures thereof.

After the aforementioned rinsing, the substrate is dried and the imaged film finally cured. That is to say, the image is fixed. Where the remaining layer has not been exposed during the imagewise exposure, image fixing is generally accomplished by causing a reaction within the remaining portions of the film. Such reaction is generally a cross-linking reaction that can be initiated by heating and/or non-imagewise or blanket exposure of the remaining material. Such exposure and heating can be in separate steps or combined as is found appropriate for the specific use of the imaged film. The blanket exposure is generally performed using the same energy source as employed in the imagewise exposure although any appropriate energy source can be employed. The heating is generally carried out at a desirable temperature, for example, from above 110° C. for a time of from several minutes to one or more hours. Where the remaining layer has been exposed during the imagewise exposure, image fixing is generally accomplished by a heating step to be tailored to complete any reaction initiated by the exposure. However an additional blanket exposure and heating, as discussed above, can also be employed. It should be realized, however, that the choice of a final cure process is also a function of the type of device being formed; thus a final fixing of the image may not be a final cure where the remaining layer is to be used as an adhesive layer or structure.

Accordingly, in some embodiments the resulting imagewise film or layer is cured by heating the patterned and develwise oped substrate at a temperature of from about 120° C. to about 250° C. for about 20 minutes to about 240 minutes. In some other embodiments such curing is carried out at a temperature of from about 130° C. to about 200° C. for about 30 minutes to about 180 minutes. In yet some other embodiments such curing is carried out at a temperature of from about 150° C. to about 180° C. for about 60 minutes to about 120 minutes. Finally, in some other embodiments of this invention, the curing is performed at a temperature of from about 130° C. to about 200° C. at an incremental heating ramp of about 5° C./minute and for about 1 to 3 hours.

The devices are produced by using embodiments of the alkali soluble photosensitive resin composition of the present invention to form layers which are characterized as having high heat resistance, an appropriate water absorption rate, high transparency, and low permittivity. In addition, such layers generally have an advantageous coefficient of elasticity after curing.

As previously mentioned, exemplary applications for embodiments of the photosensitive compositions in accordance with the present invention include redistribution layer, die attach adhesive, wafer bonding adhesive, insulation films (interlayer dielectric layers), protecting films (passivation layers), mechanical buffer films (stress buffer layers) or flattening films for a variety of semiconductor devices, printed wiring boards. Specific applications of such embodiments encompass a die-attach adhesive to form a single or multilayer semiconductor device; dielectric film which is formed on a semiconductor device; a buffer coat film which is formed on the passivation film; an interlayer insulation film which is formed over a circuit formed on a semiconductor device.

Accordingly, some embodiments in accordance with the present invention therefore provide a positive tone photosensitive polymer composition which exhibits enhanced characteristics with respect to one or more of mechanical properties (such as low-stress, retained elongation to break after aging) and at least equivalent chemical resistance, as compared to alternate materials. In addition such embodiments provide generally excellent electrical insulation, adhesion to the substrate, and the like. Thus semiconductor devices, device packages, and display devices are provided that incorporate embodiments in accordance with the present invention.

Advantageously, it has now been found that the photosensitive compositions of this invention are useful to form adhesive layers for bonding the semiconductor chips to each other, such as in chip-stack applications. For example, a redistribution layer used for such a purpose is composed of a cured product of the photosensitive adhesive composition of the present invention. Surprisingly, it has now been found that although the adhesive layer is a single-layer structure, it not only exhibits sufficient adhesiveness to the substrate but also is free of significant stress resulting due to the curing step. Accordingly, it is now possible to avoid undesirably thick layer of film encompassing the chip as a laminate. It has been further observed that the laminates formed in accordance with the present invention are reliable in that the relaxation of stress concentration between layers caused by thermal expansion difference or the like can be obtained. As a result, the semiconductor device having low height and high reliability can be obtained. That is, devices with low aspect ratio and low thickness can be obtained. Such semiconductor device becomes particularly advantageous to electronic equipment, which has very small internal volume and is in use while carrying as a mobile device, for example. Even more advantageously, by practice of this invention it is now possible to form a variety of electronic devices featuring hitherto unachievable level of miniaturization, thinning and lightweight, and the function of the semiconductor device is not easily damaged even if such devices are subject to rugged operations such as swinging or dropping.

Accordingly, in some of the embodiments of this invention there is also provided a cured product obtained by curing the photosensitive composition as described herein. In another embodiment there is also provided an optoelectronic or microelectronic device comprising the cured product of this invention as described herein.

Advantageously it has also been found that the composition of this invention features low dielectric constant, generally less than 3.9, as described herein. Accordingly, in some of the embodiments the cured product obtained from the composition of this invention exhibits a dielectric constant of 3.6 or less at 1 MHz. In some other embodiments the cured product obtained from the composition of this invention exhibits a dielectric constant of 3.2 or less at 1 MHz. In yet some other embodiments the cured product obtained from the composition of this invention exhibits a dielectric constant of 3.0 or less at 1 MHz.

Furthermore, it has also been observed that the cured product encompassing the compositions of this invention exhibits excellent transparent properties at various wavelengths of light. That is, the cured products of this invention are transparent to lights of various wavelengths thus absorbing very little or no light energy. It should be noted that the curing step is generally carried out after blanket (flood) exposure of the entire coated film. That is, the entire film is exposed to a suitable radiation, such as for example, exposure to radiation at 365 nm without any mask in order to completely bleach any PAC present in the composition. The PAC bleaching step generally increases the transparency of the film. Accordingly, in some embodiments the cured product encompassing the compositions of this invention is having a transparency at 400 nm of more than 85% after curing at 250° C. for 30 minutes. In some other embodiments the cured product encompassing the compositions of this invention is having a transparency at 400 nm of more than 90% after curing at 250° C. for 30 minutes. In yet some other embodiments the cured product encompassing the compositions of this invention is having a transparency at 400 nm of more than 95% after curing at 250° C. for 30 minutes.

This invention is further illustrated by the following examples which are provided for illustration purposes and in no way limit the scope of the present invention.

EXAMPLES

General

The following definitions have been used in the Examples that follow unless otherwise indicated:
NBSiMe$_3$: bicyclo[2.2.1]hept-5-en-2-yltrimethylsilane; BuDMMINB: 1-(4-(bicyclo[2.2.1]hept-5-en-2-yl)butyl)-3,4-dimethyl-1H-pyrrole-2,5-dione; NBTON: 5-((2-(2-methoxyethoxy)ethoxy)methyl)bicyclo-[2.2.1]hept-2-ene; DecNB: 5-decylbicyclo[2.2.1]hept-2-ene; MA: maleic anhydride; AIBN: azobisisobutyronitrile; THF: tetrahydrofuran; MEK: methyl ethyl ketone; NMP: N-methyl-2-pyrrolidone; DMSO: dimethylsulfoxide; MEA: mono-ethanolamine; DMSO-d6: perdeuterated dimethyl sulfoxide; TMPTGE: trimethylolpropane triglycidylether; MA: maleic anhydride repeat unit; MI: maleimide repeat unit; COMA: co-, ter-, tetra-polymers of maleic anhydride and other olefins as described herein; ROMA: ring opened co-, ter-, tetra-polymers of maleic anhydride and other olefins as described herein; ROMI: amine ring-opened maleimide containing co-, ter-, tetra-polymers of maleic anhydride and other olefins as described herein; TS: total solid; HPLC: high performance liquid chromatography; GPC: gel permeation chromatography; $M_w$: weight average molecular weight; $M_n$: number average molecular weight; FT-IR: Fourier transform-infrared; NMR: nuclear magnetic resonance; TGA: thermogravimetric analysis.

The following examples describe the procedures used for the preparation of various starting materials employed in the preparation of the compounds of this invention.

Example 1

NBSiMe$_3$/BuDMMINB/MA (40/10/50) Terpolymer

Maleic Anhydride (MA, 4.9 g, 50 mmol), NBSiMe$_3$ (6.64 g, 40 mmol), BuDMMINB (2.73 g, 10 mmol) and toluene (7.1 g) was charged to an appropriately sized reaction vessel. The solution was sparged with nitrogen for 30 min to remove oxygen and then heated with stirring to 65° C. The mixture was allowed to stir at 65° C. for 20 hrs. The conversion of monomers to polymer was estimated as 87% based on the total solid (non-volatile part) measurement of the reaction mixture (GPC (THF) $M_w$=8,050, $M_n$=3,750). The FT-IR spectrum obtained for the polymer in THF solution showed peaks corresponding to cyclic anhydride (MA) at 1777 and 1850 cm$^{-1}$. FT-IR peak corresponding to di-methyl maleimide group of BuDMMINB was seen at 1705 cm$^{-1}$.

Example 2

NBSiMe$_3$/DecNB/BuDMMINB/MA (20/20/10/50)Tetrapolymer

Maleic Anhydride (MA, 4.9 g, 50 mmol), NBSiMe$_3$ (3.32 g, 20 mmol), DecNB (4.68 g, 20 mmol), BuDMMINB (2.73 g, 10 mmol) and toluene (7.9 g) was charged to an appropriately sized reaction vessel. The solution was sparged with nitrogen for 30 min to remove oxygen and then heated with stirring to 65° C. The mixture was allowed to stir at 65° C. for 20 hrs. The conversion of monomers to polymer was estimated as 92% based on the total solid (non-volatile part) measurement of the reaction mixture (GPC (THF) $M_w$=10,250, $M_n$=4,600). The FT-IR spectrum obtained for the polymer in THF solution showed peaks corresponding to cyclic anhydride (MA) at 1776 and 1851 cm$^{-1}$. FT-IR peak corresponding to di-methyl maleimide group of BuDMMINB was seen at 1706 cm$^{-1}$.

Example 3

NBSiMe$_3$/NBTON/BuDMMINB/MA (20/20/10/50)Tetrapolymer

Maleic Anhydride (MA, 4.9 g, 50 mmol), NBSiMe$_3$ (3.32 g, 20 mmol), NBTON (4.53 g, 20 mmol), BuDMMINB (2.73 g, 10 mmol) and toluene (7.8 g) was charged to an appropriately sized reaction vessel. The solution was sparged with nitrogen for 30 min to remove oxygen and then heated with stirring to 65° C. The mixture was allowed to stir at 65° C. for 20 hrs. The conversion of monomers to polymer was estimated as 83% based on the total solid (non-volatile part) measurement of the reaction mixture (GPC (THF) $M_w$=9650, $M_n$=4400). The FT-IR spectrum obtained for the polymer in THF solution showed peaks corresponding to cyclic anhydride (MA) at 1776 and 1850 cm$^{-1}$. FT-IR peak corresponding to di-methyl maleimide group of BuDMMINB was seen at 1705 cm$^{-1}$.

Example 4

Amine Treatment of Polymers with Alkyl Amines

Various polymers of this invention as described in Example 1 through 3 can be used in this Example 4 to form various amine reacted polymers of this invention.

Polymer (5 g) of Example 1 is dissolved in toluene to obtain 20 wt. % solution and corresponding amounts of various amines as listed in Table 1 are added to the reaction vessel and stirred at room temperature for 2-3 hrs. After the specified reaction times, excess formic acid is added and washed with water three times. Portions of these amine treated solutions are added to excess hexanes and the solids obtained are washed with hexanes. The amine treated solid polymers are dried in a vacuum oven at room temperature for overnight. Dissolution rates of thin films spun on Si-wafers in 2.38% (w/w) TMAH can be measured for these solutions. The presence of amine functionality can be confirmed by either IR or NMR analyses.

TABLE 1

| Amine | (g, mol) |
|---|---|
| 1-C$_4$H$_9$NH$_2$ | 3.9, 0.053 |
| 1-C$_8$H$_{17}$NH$_2$ | 6.8, 0.053 |
| 1-C$_{12}$H$_{25}$NH$_2$ | 10.6, 0.057 |
| 1-C$_{12}$H$_{25}$NH$_2$ | 10.6, 0.057 |
| 1-C$_{12}$H$_{25}$NH$_2$ | 10.6, 0.057 |
| 1-C$_{16}$H$_{33}$NH$_2$ | 13.8, 0.057 |
| 1-C$_{16}$H$_{33}$NH$_2$ | 13.8, 0.057 |
| 1-C$_{16}$H$_{33}$NH$_2$ | 13.8, 0.057 |
| 1-C$_{18}$H$_{37}$NH$_2$ | 15.3, 0.057 |

Example 5

Polymer Composition/Formulations of ROM (Polymers (Hereinafter Referred to as "FP")

ROMI polymers obtained from Examples 1 to 3 can be formulated into various polymer compositions/formulations of this invention using one of the following protocols:

(A) Polymer dissolved in PGMEA to form 25 to 35 wt. % solution, and used as such. These compositions contain no other additives.

(B) Polymer dissolved in NMP to form 25 to 35 wt. % solution, and used as such. These compositions contain no other additives.

(C) Polymer dissolved in GBL to form 25 to 35 wt. % solution, and used as such. These compositions contain no other additives.

(D) Polymer dissolved in PGMEA or NMP to form 25 to 35 wt. % solutions and TrisP 3M6C-2-201 (20 wt. % of the polymer, i.e., 20 parts per hundred parts of polymer, 20 pphr) added.

(E) Polymer dissolved in PGMEA to form 25 to 35 wt. % solutions and TrisP 3M6C-2-201 (25 wt. % of the polymer, i.e., 25 parts per hundred parts of polymer, 25 pphr) added.

(F) Polymer dissolved in NMP to form 25 to 35 wt. % solutions and TrisP 3M6C-2-201 (25 wt. % of the polymer, i.e., 25 parts per hundred parts of polymer, 25 pphr) added.

(G) Polymer dissolved in PGMEA to form 25 to 35 wt. % solutions and TrisP 3M6C-2-201 (27.5 wt. % of the polymer, i.e., 27.5 parts per hundred parts of polymer, 27.5 pphr) added.

(H) Polymer dissolved in PGMEA to form 25 to 35 wt. % solutions and TrisP 3M6C-2-201 (30 wt. % of the polymer, i.e., 30 parts per hundred parts of polymer, 30 pphr) added.

(I) Polymer dissolved in NMP to form 25 to 35 wt. % solutions and TrisP 3M6C-2-201 (30 wt. % of the polymer, i.e., 30 parts per hundred parts of polymer, 30 pphr) added.

(J) Polymer dissolved in PGMEA to form 25 to 35 wt. % solutions and TrisP 3M6C-2-201 (25 wt. % of the polymer, i.e., 25 parts per hundred parts of polymer, 25 pphr) and Si-75 (3 wt. % of the polymer, i.e., 3 parts per hundred parts of polymer, 3 pphr) added.

(K) Polymer dissolved in GBL to form 25 to 35 wt. % solutions and TrisP 3M6C-2-201 (25 wt. % of the polymer, i.e., 25 parts per hundred parts of polymer, 25 pphr) and Si-75 (3 wt. % of the polymer, i.e., 3 parts per hundred parts of polymer, 3 pphr) added.

Additionally, various amounts of cross linkers (TMPTGE, PEGDGE, PPGDGE, EPON-862, Heloxy-65, Heloxy-84 or GE-36 and BY16-115) are also added to the formulations depending upon the intended results.

Example 6

Spin Coating Procedures

The polymer compositions made in accordance with one of the protocols set forth in Example 5 are spin coated on to a suitable substrate using one of the following spin protocols (hereinafter referred to as "SP"):
(A) A formulation of Example 5 is spun onto a suitable substrate such as a silicon wafer at 200-700 rpm for 30-40 seconds;
(B) A formulation of Example 5 is spun onto a suitable substrate such as a silicon wafer first at 500 rpm for 10 seconds and then at 600-2200 rpm for 30 seconds.

Example 7

Post Apply Bake (PAB) Protocols

The spin coated samples from Example 6 are post apply baked (hereinafter referred to as "PAB") using any one of the following procedures:
(A) 90° C./5 min; (B) 100° C./3 min; (C) 100° C./5 min; (D) 110° C./3 min; (E) 110° C./5 min; (F) 115° C./3 min; (G) 115° C./5 min; (H) 120° C./3 min; (I) 120° C./5 min; (I) 130° C./3 min; (J) 105° C./3 min.

Example 8

Cure Protocols

The spin coated film samples formed in accordance with the procedures set forth in one of Examples 7 are baked, if needed, on a hot plate in air or in an oven under nitrogen atmosphere to remove residual solvents from the films or to obtain thermally cured films or to apply thermal stress to the films. Any one of the following cure protocols was used:
(A) 130° C./30 min; (B) 150° C./30 min; (C) 150° C./60 min; (D) 180° C./30 min; (E) 180° C./60 min; and (F) 180° C./120 min; (G) 200° C./30 min; (H) 200° C./60 min; (I) 200° C./120 min; (J) 220° C./60 min.

Example 9

Aqueous Base Development

The spin coated substrates as obtained in Examples 8 are imagewise exposed to a suitable actinic radiation either using a patterned mask or without a mask and then developed as follows. The exposed spun coated substrate is immersed in developer (2.38 wt. % TMAH) for various times (immersion development). The unexposed area film thickness loss or dark field loss (DFL) of the films that were formulated for positive tone (PT) image development is determined by measuring the film thicknesses before and after development in an unexposed region of the film and reported as percent loss of the film thickness in areas of the film that is not exposed to the radiation.

Example 10

Photo Imaging Studies

Amine treated polymer from Example 4 is formulated into polymer compositions using one of the procedures set forth in Example 5. The formulations so formed are spun onto 4 inch thermal oxide silicon wafer using one of the procedures as set forth in Example 6 and post apply baked (PAB) in accordance with one of the procedures set forth in Example 7 to obtain a polymer film of about 10 microns. After exposure through a mask, the wafer is developed in accordance with the procedures set forth in Example 9 using 2.38 wt. % TMAH developer. The exposure dose (EXD) is reported in mJ/cm$^2$, where such is reflective of both the energy of a broad band Hg-vapor light source used to expose (at 365 nm using a band pass filter) the sample and the time of that exposure. In general, all of the samples are expected to exhibit good film properties.

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:
1. A polymer comprising:
a first type of repeating unit represented by formula (IA), said first type of repeating unit is derived from a monomer of formula (I):

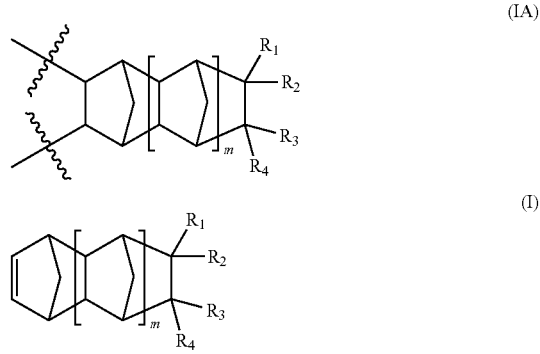

wherein:
m is an integer 0, 1 or 2;
at least one of $R_1$, $R_2$, $R_3$ and $R_4$ independently represents a group of formula (A):

$$—SiR_5R_6R_7 \quad (A)$$

wherein:
$R_5$, $R_6$, and $R_7$ are the same or different and each independently of one another is selected from linear or branched $(C_1-C_6)$alkyl, $(C_5-C_8)$cycloalkyl, $(C_6-C_{10})$aryl or $(C_7-C_{12})$aralkyl;
remaining one or more of $R_1$, $R_2$, $R_3$ and $R_4$ independently represents hydrogen, linear or branched $(C_1-C_{16})$alkyl, hydroxy$(C_1-C_{16})$alkyl, perfluoro$(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_3)$alkyl, perfluoro$(C_6-C_{10})$aryl, perfluoro$(C_6-C_{10})$aryl$(C_1-C_3)$alkyl, $(C_5-C_{10})$heteroaryl, $(C_5-C_{10})$heteroaryl$(C_1-C_8)$alkyl, hydroxy, $(C_1-C_{12})$alkoxy, $(C_3-C_{12})$cycloalkoxy, $(C_6-C_{12})$bicycloalkoxy, $(C_7-C_{14})$tricycloalkoxy, $(C_6-C_{10})$aryloxy$(C_1-C_3)$alkyl, $(C_5-C_{10})$heteroaryloxy$(C_1-C_3)$alkyl, $(C_6-C_{10})$aryloxy, $(C_5-C_{10})$heteroaryloxy, $(C_1-C_6)$acyloxy, halogen, di$(C_1-C_2)$alkylmaleimide$(C_3-C_6)$alkyl, di$(C_1-C_2)$alkylmaleimide$(C_2-C_6)$alkoxy$(C_1-C_2)$alkyl, oxiranyl$(C_0-C_8)$alkyl, oxiranyl $(CH_2)_aO(CH_2)_b$—, or a group of formula (B):

$$—(CH_2)_a—(OCH_2—CH_2)_b—OR \quad (B)$$

wherein:
a is an integer 0, 1, 2, 3 or 4;
b is an integer 0, 1, 2, 3 or 4; and
R is linear or branched $(C_1-C_6)$alkyl, $(C_5-C_8)$cycloalkyl, $(C_6-C_{10})$aryl or $(C_7-C_{12})$aralkyl;

optionally a second type of repeating unit represented by formula (IIA), said second type of repeating unit is derived from a monomer of formula (II):

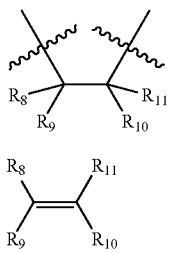

(IIA)

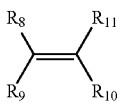

(II)

wherein
$R_8$, $R_9$, $R_{10}$ and $R_{11}$ are the same or different and each independently of one another is selected from hydrogen, linear or branched $(C_1-C_6)$alkyl, $(C_5-C_8)$cycloalkyl, $(C_6-C_{10})$aryl or $(C_7-C_{12})$aralkyl or a group of formula (C):

   —SiR$_5$R$_6$R$_7$   (C)

wherein:
$R_5$, $R_6$, and $R_7$ are the same or different and each independently of one other is selected from linear or branched $(C_1-C_6)$alkyl, $(C_5-C_8)$cycloalkyl, $(C_6-C_{10})$aryl or $(C_7-C_{12})$aralkyl; or
one of $R_8$ or $R_9$ taken together with one of $R_{10}$ or $R_{11}$ and the carbon atoms to which they are attached form a $(C_5-C_8)$cycloalkyl ring; and one or more of a third type of repeating unit chosen from formulae (IIIC), (IIIA), (IIIB), (IIID) and (IIIE), said third type of repeating unit is derived from a monomer of formula (III):

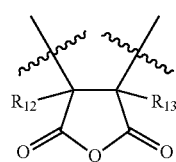

(IIIC)

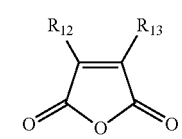

(III)

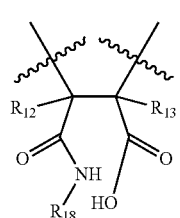

(IIIA)

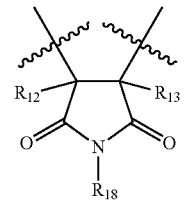

(IIIB)

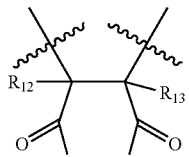

(IIID)

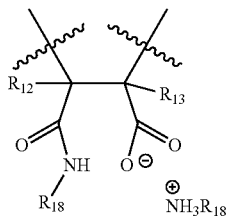

(IIIE)

wherein:
$R_{12}$ and $R_{13}$ are each independently of one another represents hydrogen or linear or branched $(C_1-C_9)$alkyl or fluorinated or perfluorinated $(C_1-C_9)$alkyl;
$R_{18}$ is hydrogen, linear or branched $(C_1-C_{20})$alkyl, $(C_5-C_8)$cycloalkyl, $(C_6-C_{10})$aryl or $(C_7-C_{12})$aralkyl; and a fourth type of repeating unit represented by formula (IVA), said fourth type of repeating unit is derived from a monomer of formula (IV):

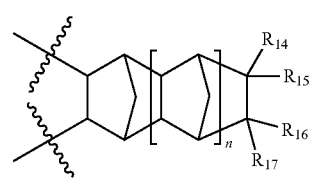

(IVA)

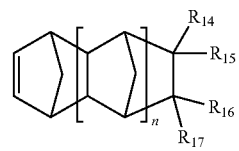

(IV)

wherein:
n is an integer 0, 1 or 2;
$R_{14}$, $R_{15}$, $R_{16}$ and $R_{17}$ independently represents hydrogen, linear or branched $(C_1-C_{16})$alkyl, hydroxy$(C_1-C_{16})$alkyl, perfluoro$(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_3)$alkyl, perfluoro$(C_6-C_{10})$aryl, perfluoro$(C_6-C_{10})$aryl$(C_1-C_3)$alkyl, $(C_5-C_{10})$heteroaryl, $(C_5-C_{10})$heteroaryl$(C_1-C_8)$alkyl, hydroxy, $(C_1-C_{12})$alkoxy, $(C_3-C_{12})$cycloalkoxy, $(C_6-C_{12})$bicycloalkoxy, $(C_7-C_{14})$tricycloalkoxy, $(C_6-C_{10})$aryloxy$(C_1-C_3)$alkyl, $(C_5-C_{10})$heteroaryloxy$(C_1-C_3)$alkyl, $(C_6-C_{10})$aryloxy, $(C_5-C_{10})$heteroaryloxy, $(C_1-C_6)$acyloxy, halogen, oxiranyloxy($C_1$-$C_3$)alkyl, oxiranyl($C_0$-$C_8$)alkyl, oxiranyl $(CH_2)_aO(CH_2)_b$—, or a group of formula (B):

$$—(CH_2)_a—(OCH_2—CH_2)_b—OR \qquad (B)$$

wherein:
a is an integer 0, 1, 2, 3 or 4;
b is an integer 0, 1, 2, 3 or 4; and
R is linear or branched ($C_1$-$C_6$)alkyl, ($C_5$-$C_5$)cycloalkyl, ($C_6$-$C_{10}$)aryl or ($C_7$-$C_{12}$)aralkyl; and
wherein each of aforementioned groups, where valence is permissible, is optionally substituted with one or more groups selected from linear or branched ($C_1$-$C_6$)alkyl, ($C_3$-$C_7$)cycloalkyl, ($C_1$-$C_6$)perfluoroalkyl, ($C_1$-$C_6$)alkoxy, ($C_3$-$C_7$)cycloalkoxy, ($C_1$-$C_6$)perfluoroalkoxy, halogen, hydroxy, linear or branched hydroxy($C_1$-$C_6$)alkyl, ($C_6$-$C_{10}$)aryl or ($C_7$-$C_{12}$) aralkyl.

2. The polymer of claim 1 wherein said polymer comprises 10 to 75 mole percent of first type of repeating units, 0 to 90 mole percent of second type of repeating units and 10 to 60 mole percent of third type of repeating units.

3. The polymer of claim 1 wherein:
at least one of $R_1$, $R_2$, $R_3$ and $R_4$ independently represents a group of formula (A):

$$—SiR_5R_6R_7 \qquad (A)$$

wherein:
$R_5$, $R_6$, and $R_7$ are the same or different and each independently of one other is selected from linear or branched ($C_1$-$C_6$)alkyl;
remaining one or more of $R_1$, $R_2$, $R_3$ and $R_4$ independently represents hydrogen, linear or branched ($C_1$-$C_{12}$)alkyl, perfluoro($C_1$-$C_{12}$)alkyl, ($C_5$-$C_{10}$)heteroaryl($C_1$-$C_8$)alkyl, oxiranyl($C_0$-$C_8$)alkyl, oxiranyl$(CH_2)_aO(CH_2)_b$—, or a group of formula (B):

$$—(CH_2)_a—(OCH_2—CH_2)_b—OR \qquad (B)$$

wherein:
a is an integer 0, 1, 2, 3 or 4;
b is an integer 0, 1, 2, 3 or 4; and
R is linear or branched ($C_1$-$C_6$)alkyl; and
$R_{12}$ and $R_{13}$ are each hydrogen.

4. The polymer of claim 1, wherein:
n is an integer 0 or 1;
$R_{14}$, $R_{15}$, $R_{16}$ and $R_{17}$ independently represents hydrogen, linear or branched ($C_1$-$C_{16}$)alkyl, perfluoro($C_1$-$C_{12}$) alkyl, ($C_6$-$C_{10}$)aryl($C_1$-$C_3$)alkyl, perfluoro($C_6$-$C_{10}$)aryl, ($C_5$-$C_{10}$)heteroaryl($C_1$-$C_8$)alkyl, oxiranyloxy($C_1$-$C_3$) alkyl, oxiranyl($C_0$-$C_8$)alkyl or a group of formula (B):

$$—(CH_2)_a—(OCH_2—CH_2)_b—OR \qquad (B)$$

wherein:
a is an integer 0, 1, 2, 3 or 4;
b is an integer 0, 1, 2, 3 or 4; and
R is linear or branched $C_1$-$C_6$-alkyl.

5. The polymer of claim 1 wherein said third type of repeating unit is of the formula (IIIA) or (IIIB):

(IIIA)

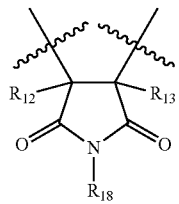

(IIIB)

wherein:
$R_{12}$ and $R_{13}$ are each independently of one another represents hydrogen or methyl; and
$R_{18}$ is selected from hydrogen, n-octyl, n-dodecyl, n-hexadecyl and n-octadecyl.

6. The polymer of claim 1 wherein first type of repeating unit is derived from a monomer selected from the group consisting of:
bicyclo[2.2.1]hept-5-en-2-yltrimethylsilane;
bicyclo[2.2.1]hept-5-en-2-yltriethylsilane;
bicyclo[2.2.1]hept-5-en-2-yldimethyl-tert-butylsilane; and
bicyclo[2.2.1]hept-5-en-2-yldimethylphenylsilane.

7. The polymer of claim 1 wherein second type of repeating unit is derived from a monomer selected from the group consisting of:
2-methylprop-1-ene;
2-methylpent-1-ene;
2,4,4-trimethylpent-1-ene;
2,4,4-trimethylpent-2-ene;
trimethyl(vinyl)silane; and
styrene.

8. The polymer of claim 1 wherein fourth type of repeating unit is derived from a monomer selected from the group consisting of:
bicyclo[2.2.1]hept-2-ene;
5-methylbicyclo[2.2.1]hept-2-ene;
5-ethylbicyclo[2.2.1]hept-2-ene;
5-hexylbicyclo[2.2.1]hept-2-ene;
5-octylbicyclo[2.2.1]hept-2-ene;
5-decylbicyclo[2.2.1]hept-2-ene;
5-(2-(2-methoxyethoxy)ethoxy)methyl)bicyclo[2.2.1] hept-2-ene;
1-(4-(bicyclo[2.2.1]hept-5-en-2-yl)butyl)-3,4-dimethyl-1H-pyrrole-2,5-dione;
2-((bicyclo[2.2.1]hept-5-en-2-ylmethoxy)methyl)oxirane; and
5-phenethylbicyclo[2.2.1]hept-2-ene.

9. A photoimageable composition comprising:
a polymer containing:
a first type of repeating unit represented by formula (IA), said first type of repeating unit is derived from a monomer of formula (I):

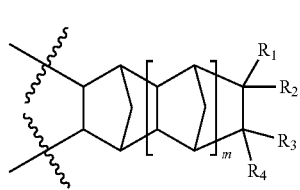

(IA)

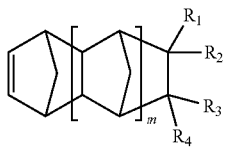
(I)

wherein:
m is an integer 0, 1 or 2;
at least one of $R_1$, $R_2$, $R_3$ and $R_4$ independently represents a group of formula (A):

$$—SiR_5R_6R_7 \quad (A)$$

wherein:
$R_5$, $R_6$, and $R_7$ are the same or different and each independently of one another is selected from linear or branched ($C_1$-$C_6$)alkyl, ($C_5$-$C_8$)cycloalkyl, ($C_6$-$C_{10}$)aryl or ($C_7$-$C_{12}$)aralkyl;
remaining one or more of $R_1$, $R_2$, $R_3$ and $R_4$ independently represents hydrogen, linear or branched ($C_1$-$C_{16}$)alkyl, hydroxy($C_1$-$C_{16}$)alkyl, perfluoro($C_1$-$C_{12}$) alkyl, ($C_3$-$C_{12}$)cycloalkyl, ($C_6$-$C_{12}$)bicycloalkyl, ($C_7$-$C_{10}$)tricycloalkyl, ($C_6$-$C_{10}$)aryl, ($C_6$-$C_{10}$)aryl($C_1$-$C_3$) alkyl, perfluoro($C_6$-$C_{10}$)aryl, perfluoro($C_6$-$C_{10}$)aryl ($C_1$-$C_3$)alkyl, ($C_5$-$C_{10}$)heteroaryl, ($C_5$-$C_{10}$)heteroaryl ($C_1$-$C_8$)alkyl, hydroxy, ($C_1$-$C_{12}$)alkoxy, ($C_3$-$C_{12}$) cycloalkoxy, ($C_6$-$C_{12}$)bicycloalkoxy, ($C_7$-$C_{14}$) tricycloalkoxy, ($C_6$-$C_{10}$)aryloxy($C_1$-$C_3$)alkyl, ($C_5$-$C_{10}$)heteroaryloxy($C_1$-$C_3$)alkyl, ($C_6$-$C_{10}$)aryloxy, ($C_5$-$C_{10}$)heteroaryloxy, ($C_1$-$C_6$)acyloxy, halogen, di($C_1$-$C_2$)alkylmaleimide($C_3$-$C_6$)alkyl, di($C_1$-$C_2$) alkylmaleimide-($C_2$-$C_6$)alkoxy($C_1$-$C_2$)alkyl, oxiranyl($C_0$-$C_8$)alkyl, oxiranyl($CH_2$)$_a$O($CH_2$)$_b$—, or a group of formula (B):

$$—(CH_2)_a—(OCH_2—CH_2)_b—OR \quad (B)$$

wherein:
a is an integer 0, 1, 2, 3 or 4;
b is an integer 0, 1, 2, 3 or 4; and
R is linear or branched ($C_1$-$C_6$)alkyl, ($C_5$-$C_8$)cycloalkyl, ($C_6$-$C_{10}$)aryl or ($C_7$-$C_{12}$)aralkyl;
optionally a second type of repeating unit represented by formula (IIA), said second type of repeating unit is derived from a monomer of formula (II):

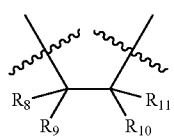
(IIA)

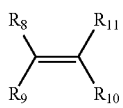
(II)

wherein
$R_8$, $R_9$, $R_{10}$ and $R_{11}$ are the same or different and each independently of one another is selected from hydrogen, linear or branched ($C_1$-$C_6$)alkyl, ($C_5$-$C_8$)cycloalkyl, ($C_6$-$C_{10}$)aryl or ($C_7$-$C_{12}$)aralkyl or a group of formula (C):

$$—SiR_5R_6R_7 \quad (C)$$

wherein:
$R_5$, $R_6$, and $R_7$ are the same or different and each independently of one other is selected from linear or branched ($C_1$-$C_6$)alkyl, ($C_5$-$C_8$)cycloalkyl, ($C_6$-$C_{10}$) aryl or ($C_7$-$C_{12}$)aralkyl; or
one of $R_8$ or $R_9$ taken together with one of $R_{10}$ or $R_{11}$ and the carbon atoms to which they are attached form a ($C_5$-$C_8$)cycloalkyl ring; and
one or more of a third type of repeating unit represented by formulae (IIIA), (IIIB), (IIIC), (IIID) or (IIIE), said third type of repeating unit is derived from a monomer of formula (III):

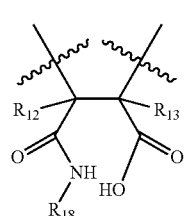
(IIIA)

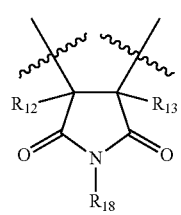
(IIIB)

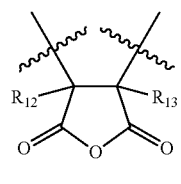
(IIIC)

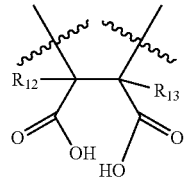
(IIID)

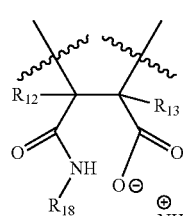
(IIIE)

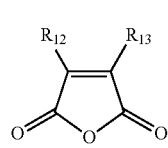
(III)

wherein:
$R_{12}$ and $R_{13}$ are each independently of one another represents hydrogen or linear or branched ($C_1$-$C_9$)alkyl or fluorinated or perfluorinated ($C_1$-$C_9$)alkyl;

$R_{18}$ is hydrogen, linear or branched ($C_1$-$C_{20}$)alkyl, ($C_5$-$C_8$)cycloalkyl, ($C_6$-$C_{10}$)aryl or ($C_7$-$C_{12}$)aralkyl; with the proviso that when there is only one of repeat unit of formulae (IIIA) through (IIIE) is present, then said one repeat unit is other than formula (IIIC); and wherein each of aforementioned groups, where valence is permissible, is optionally substituted with one or more groups selected from linear or branched ($C_1$-$C_6$)alkyl, ($C_3$-$C_7$)cycloalkyl, ($C_1$-$C_6$)perfluoroalkyl, ($C_1$-$C_6$)alkoxy, ($C_3$-$C_7$)cycloalkoxy, ($C_1$-$C_6$)perfluoroalkoxy, halogen, hydroxy, linear or branched hydroxy($C_1$-$C_6$)alkyl, ($C_6$-$C_{10}$)aryl or ($C_7$-$C_{12}$)aralkyl; and a fourth type of repeating unit represented by formula (IVA), said fourth type of repeating unit is derived from a monomer of formula (IV):

(IVA)

(IV)

wherein:

n is an integer 0, 1 or 2;

$R_{14}$, $R_{15}$, $R_{16}$ and $R_{17}$ independently represents hydrogen, linear or branched ($C_1$-$C_{16}$)alkyl, hydroxy($C_1$-$C_{16}$)alkyl, perfluoro($C_1$-$C_{12}$)alkyl, ($C_3$-$C_{12}$)cycloalkyl, ($C_6$-$C_{12}$)bicycloalkyl, ($C_7$-$C_{14}$)tricycloalkyl, ($C_6$-$C_{10}$)aryl, ($C_6$-$C_{10}$)aryl($C_1$-$C_3$)alkyl, perfluoro($C_6$-$C_{10}$)aryl, perfluoro($C_6$-$C_{10}$)aryl($C_1$-$C_3$)alkyl, ($C_5$-$C_{10}$)heteroaryl, ($C_5$-$C_{10}$)heteroaryl($C_1$-$C_8$)alkyl, hydroxy, ($C_1$-$C_{12}$)alkoxy, ($C_3$-$C_{12}$)cycloalkoxy, ($C_6$-$C_{12}$)bicycloalkoxy, ($C_7$-$C_{14}$)tricycloalkoxy, ($C_6$-$C_{10}$)aryloxy($C_1$-$C_3$)alkyl, ($C_5$-$C_{10}$)heteroaryloxy($C_1$-$C_3$)alkyl, ($C_6$-$C_{10}$)aryloxy, ($C_5$-$C_{10}$)heteroaryloxy, ($C_1$-$C_6$)acyloxy, halogen, oxiranyloxy($C_1$-$C_3$)alkyl, oxiranyl($C_0$-$C_8$)alkyl, oxiranyl($CH_2$)$_a$O($CH_2$)$_b$—, or a group of formula (B):

$(CH_2)_a$—$(OCH_2$—$CH_2)_b$—OR      (B)

wherein:

a is an integer 0, 1, 2, 3 or 4;

b is an integer 0, 1, 2, 3 or 4; and

R is linear or branched ($C_1$-$C_6$)alkyl, ($C_5$-$C_8$)cycloalkyl, ($C_6$-$C_{10}$)aryl or ($C_7$-$C_{12}$)aralkyl;

a photoactive compound containing a diazo functional moiety; and a carrier solvent.

10. The composition of claim 9 wherein said diazo functional moiety is of the formula (V), (VI) or (VII):

(V)

(VI)

(VII)

11. The composition of claim 10, wherein said photo active compound is selected from the group consisting of:

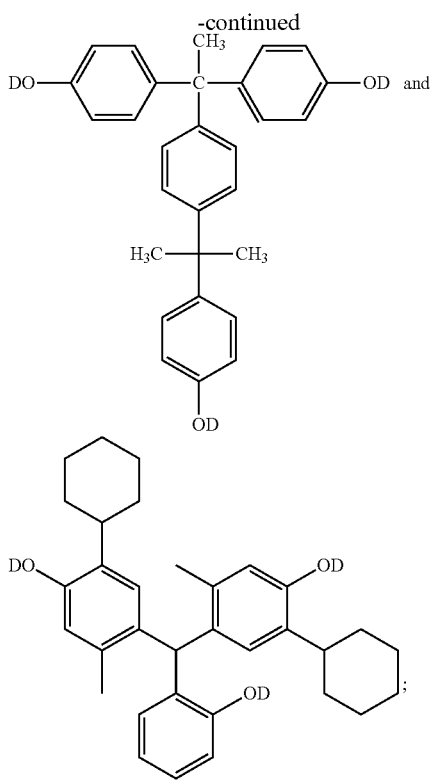

wherein at least one D is a diazo functional moiety of formula (V), (VI) or (VII) and the remainder Ds are hydrogen.

12. The composition of claim 9 wherein said carrier solvent is selected from the group consisting of: cyclohexanone, cyclopentanone, diethylene glycol dimethyl ether, propylene glycol monomethyl ether acetate (PGMEA), N-methyl-2-pyrrolidone (NMP), gamma-butyrolactone (GBL), N,N-dimethylacetamide, N,N-dimethylformamide, anisole, acetone, methyl 3-methoxypropionate, tetrahydrofuran (THF) and mixtures in any combination thereof.

13. The composition of claim 9 further comprising one or more cross-linking agents selected from the group consisting of:

2,2'-(((2-ethyl-2-((oxiran-2-ylmethoxy)methyl)propane-1,3-diyl)bis(oxy))-bis(methylene))bis(oxirane) (TMPTGE);

bis(4-(oxiran-2-ylmethoxy)phenyl)methane (EPON 862);
polyglycidyl ether of an aliphatic triol (Heloxy 84);
glycidyl ether of para-tertiary butyl phenol (Heloxy 65);
polyethylene glycol diglycidyl ether (PEGDGE);
polypropylene glycol diglycidyl ether (PPGDGE);
and mixtures in any combination thereof.

14. A method of forming a film for the fabrication of a microelectronic or optoelectronic device comprising:
coating a suitable substrate with a composition according to claim 9 to form a film;
patterning the film with a mask by exposing to a suitable radiation;
developing the film after exposure to form a photo-pattern; and
curing the film by heating to a suitable temperature.

15. The method of claim 14, where said developer is aqueous tetramethylammonium hydroxide (TMAH).

16. A cured product obtained by curing the composition of claim 9.

17. An optoelectronic or microelectronic device comprising the cured product of claim 16.

18. A composition comprising a polymer selected from the group consisting of:
a copolymer containing repeating units derived from bicyclo[2.2.1]hept-5-en-2-yltrimethylsilane and maleic anhydride ring opened with n-octyl amine, n-dodecylamine, n-hexadecylamine or n-octadecylamine;
a terpolymer containing repeat units derived from bicyclo[2.2.1]hept-5-en-2-yltrimethylsilane, 1-(4-(bicyclo[2.2.1]hept-5-en-2-yl)butyl)-3,4-dimethyl-1H-pyrrole-2,5-dione and maleic anhydride ring opened with n-octyl amine, n-dodecylamine, n-hexadecylamine or n-octadecylamine;
a tetrapolymer containing repeat units derived from bicyclo[2.2.1]hept-5-en-2-yltrimethylsilane, 5-decylbicyclo[2.2.1]hept-2-ene; 1-(4-(bicyclo[2.2.1]hept-5-en-2-yl)butyl)-3,4-dimethyl-1H-pyrrole-2,5-dione and maleic anhydride ring opened with n-octyl amine, n-dodecylamine, n-hexadecylamine or n-octadecylamine;
a tetrapolymer containing repeat units derived from bicyclo[2.2.1]hept-5-en-2-yltrimethylsilane, 5-((2-(2-methoxyethoxy)ethoxy)methyl)bicyclo[2.2.1]hept-2-ene; 1-(4-(bicyclo[2.2.1]hept-5-en-2-yl)butyl)-3,4-dimethyl-1H-pyrrole-2,5-dione and maleic anhydride ring opened with n-octyl amine, n-dodecylamine, n-hexadecylamine or n-octadecylamine;
a photoactive compound containing a diazo functional moiety; and
a carrier solvent.

* * * * *